(12) United States Patent
Yoshida et al.

(10) Patent No.: US 8,242,516 B2
(45) Date of Patent: Aug. 14, 2012

(54) ORGANIC EL DISPLAY PANEL AND METHOD OF MANUFACTURING THE SAME

(75) Inventors: Hidehiro Yoshida, Osaka (JP); Kenji Okumoto, Kyoto (JP); Keisei Yamamuro, Osaka (JP)

(73) Assignee: Panasonic Corporation, Osaka (JP)

( * ) Notice: Subject to any disclaimer, the term of this patent is extended or adjusted under 35 U.S.C. 154(b) by 312 days.

(21) Appl. No.: 12/679,322

(22) PCT Filed: Aug. 17, 2009

(86) PCT No.: PCT/JP2009/003909
§ 371 (c)(1),
(2), (4) Date: Mar. 22, 2010

(87) PCT Pub. No.: WO2010/023839
PCT Pub. Date: Mar. 4, 2010

(65) Prior Publication Data
US 2010/0219424 A1     Sep. 2, 2010

(30) Foreign Application Priority Data
Aug. 29, 2008 (JP) ................................. 2008-222552

(51) Int. Cl.
*H01L 21/00* (2006.01)
(52) U.S. Cl. ............... 257/88; 257/40; 257/89
(58) Field of Classification Search ........... 257/40, 257/88–89
See application file for complete search history.

(56) References Cited

U.S. PATENT DOCUMENTS 7,091,660 B2 *   8/2006   Park et al. .................... 313/512
7,370,926 B2 *   5/2008   Kato et al. .................... 347/12
(Continued)

FOREIGN PATENT DOCUMENTS

JP    2003-266669     9/2003
(Continued)

OTHER PUBLICATIONS

U.S. Appl. No. 12/669,094 to Nakatani et al., filed Jan. 14, 2010.
(Continued)

*Primary Examiner* — Laura Menz
(74) *Attorney, Agent, or Firm* — Greenblum & Bernstein, P.L.C.

(57) ABSTRACT

An organic EL display panel is provided which includes: a substrate which includes a plurality of luminescent regions which are arranged side by side in a specific direction and run in parallel to one another; a bank formed over the substrate, the bank defining a plurality of coating regions in each of the luminescent regions, the coating regions being aligned in a row along the long axis of the luminescent region; and a pixel electrode provided in each of the coating regions, the pixel electrode having a long axis which is in parallel with the long axis of the luminescent region, wherein, in each of the luminescent regions, the coating region positioned at a lengthwise end of the luminescent region is larger in size than the coating region positioned at a lengthwise center of the luminescent region.

4 Claims, 17 Drawing Sheets

U.S. PATENT DOCUMENTS

| | | | |
|---|---|---|---|
| 7,812,345 B2* | 10/2010 | Yoshida et al. | 257/40 |
| 7,842,947 B2* | 11/2010 | Nakatani et al. | 257/40 |
| 7,884,541 B2* | 2/2011 | Seki et al. | 313/504 |
| 7,888,867 B2* | 2/2011 | Yoshida et al. | 313/506 |
| 7,897,211 B2* | 3/2011 | Sakai et al. | 427/256 |
| 2002/0008311 A1* | 1/2002 | Kimura | 257/690 |
| 2002/0041150 A1* | 4/2002 | Kim | 313/504 |
| 2002/0097363 A1* | 7/2002 | Yudasaka | 349/138 |
| 2004/0021413 A1* | 2/2004 | Ito et al. | 313/504 |
| 2005/0156515 A1* | 7/2005 | Fukase | 313/504 |
| 2006/0046062 A1* | 3/2006 | Nishigaki et al. | 428/411.1 |
| 2007/0052119 A1* | 3/2007 | Sakai et al. | 264/1.7 |
| 2007/0138943 A1* | 6/2007 | Tano et al. | 313/503 |
| 2008/0187650 A1* | 8/2008 | Kato et al. | 427/66 |
| 2009/0072724 A1* | 3/2009 | Seki et al. | 313/504 |
| 2010/0078630 A1* | 4/2010 | Kaneta et al. | 257/40 |
| 2010/0181554 A1* | 7/2010 | Yoshida et al. | 257/40 |
| 2010/0181559 A1* | 7/2010 | Nakatani et al. | 257/40 |
| 2010/0213827 A1* | 8/2010 | Yoshida et al. | 313/504 |
| 2010/0219424 A1* | 9/2010 | Yoshida et al. | 257/88 |
| 2010/0327297 A1* | 12/2010 | Yoshida et al. | 257/89 |
| 2011/0198990 A1* | 8/2011 | Yoshida et al. | 313/504 |
| 2011/0300289 A1* | 12/2011 | Suzuki | 427/8 |
| 2012/0049175 A1* | 3/2012 | Ono et al. | 257/40 |
| 2012/0112217 A1* | 5/2012 | Yoshida et al. | 257/89 |

FOREIGN PATENT DOCUMENTS

| | | | |
|---|---|---|---|
| JP | 2004031070 A * | 1/2004 | |
| JP | 2004-087509 | 3/2004 | |
| JP | 2004-288403 | 10/2004 | |
| JP | 2004-362818 | 12/2004 | |
| JP | 2006-260779 | 9/2006 | |
| JP | 2007-090134 | 4/2007 | |
| JP | 2007-103349 | 4/2007 | |
| JP | 2007-115563 | 5/2007 | |
| JP | 2007-227127 | 9/2007 | |
| JP | 2009-70720 | 4/2009 | |
| JP | 2009247934 A * | 10/2009 | |
| JP | 2011146184 A * | 7/2011 | |

OTHER PUBLICATIONS

U.S. Appl. No. 12/677,889 to Nakatani et al., filed Mar. 12, 2010.
U.S. Appl. No. 12/680,946 to Yoshida et al., filed Mar. 31, 2010.

* cited by examiner

ORGANIC EL DISPLAY PANEL AND METHOD OF MANUFACTURING THE SAME

TECHNICAL FIELD

The present invention relates to an organic EL display panel and a method of manufacturing the same.

BACKGROUND ART

Manufacturing methods of organic EL display panel are broadly classified into two types according to the method with which their organic functional layer is formed: The first one is to form organic functional layers by vapor deposition, and the second one is to form them by solvent coating.

One representative method of the formation of organic functional layers by solvent coating involves the use of an inkjet device for discharging ink droplets, which contain organic functional material, onto a display substrate to form thereon organic functional layers (see e.g., Patent Document 1).

The organic material-containing ink is applied on luminescent regions provided on the display substrate. As used herein, the term "luminescent region" means a region in which red (R), green (G) or blue (B) sub pixels are aligned in a row. Namely, the display panel includes sets of three different color luminescent regions (red, green and blue), which are arranged side by side in a specific direction and run in parallel to one another.

The luminescent regions may be further partitioned into sub pixels by banks or may remain as linear regions without being partitioned. In the case of partitioning the luminescent regions into sub pixels by banks, the banks define regions for the sub pixels. An ink containing organic functional material is then supplied on a sub pixel basis (see e.g., Patent Documents 2-5).

By contrast, when the luminescent regions are not partitioned into sub pixels by banks (i.e., when the luminescent regions are linear), the banks define the luminescent regions. An ink containing organic functional material is then applied on a luminescent region basis (see e.g., Patent Documents 6-10).

It has been recognized that the size of ink droplets discharged from an inkjet head varies from one nozzle to another (see e.g., Patent Document 11).

Moreover, methods of equalizing the drying rates of the applied organic functional material-containing ink have been suggested in which multiple sets of sub pixels are surrounded by banks and regions defined by the banks are staggered (see e.g., Patent Document 12).

Patent Document 1: Japanese Patent Application Laid-Open No. 2004-362818
Patent Document 2: Japanese Patent Application Laid-Open No. 2004-87509
Patent Document 3: Published U.S. Patent Application No. 2002/0097363
Patent Document 4: Published U.S. Patent Application No. 2002/0008311
Patent Document 5: Published U.S. Patent Application No. 2004/0021413
Patent Document 6: U.S. Pat. No. 7,091,660
Patent Document 7: Japanese Patent Application Laid-Open No. 2007-227127
Patent Document 8: Japanese Patent Application Laid-Open No. 2004-288403
Patent Document 9: Published U.S. Patent Application No. 2002/0041150
Patent Document 10: Published U.S. Patent Application No. 2007/0138943
Patent Document 11: Japanese Patent Application Laid-Open No. 2003-266669
Patent Document 12: Japanese Patent Application Laid-Open No. 2007-115563

DISCLOSURE OF INVENTION

Problems to be Solved by the Invention

As shown in FIG. 1, when forming organic functional layers on a display substrate with an inkjet device, the conventional method includes: 1) placing inkjet head 20 of the inkjet device above or below luminescent regions 12 of display substrate 10 in the drawing, preferably in such a way that the direction in which nozzles 21 are arranged becomes perpendicular to the long axes of luminescent regions 12; and 2) moving inkjet head 20 along the long axes of luminescent regions 12 3) while discharging ink droplets from nozzles 21 to luminescent regions 12 while to form thereon organic functional layers. Hereinafter, an ink application method where an inkjet head is relatively moved along the long axes of luminescent regions will be referred to as "vertical coating."

As described above, however, the size of ink droplets discharged from an inkjet head varies from one nozzle to another. Correspondingly, when a display substrate is "vertically coated," the amount of applied ink varies from one luminescent region to another. For example, if nozzle head 20 includes nonfunctional nozzle 21$a$ which does not discharge ink as shown in FIG. 2, it results in luminescent region 12$a$ having less ink than luminescent region 12$b$. The variations in ink amount among luminescent regions in turn lead to variations in organic functional layer thickness among the luminescent regions. Moreover, the variations in organic functional layer thickness lead to variations in brightness among the luminescent regions, which causes so called "streaks" in the resulting organic EL display panel.

FIG. 3 illustrates a coating method which can overcome the above "streak" problem. This method includes:

1) placing inkjet head 20 having multiple nozzles above the edge of display substrate 10 and to the side of the length of the luminescent region of; and 2) discharging ink droplets of organic functional material from nozzles 21 to luminescent regions 12 while relatively moving inkjet head 20 in a direction perpendicular to the long axes of luminescent regions 12, to form thereon organic functional layers. Hereinafter, an ink application method where an inkjet head is relatively moved in a direction perpendicular to the long axes of luminescent regions will be referred to as "horizontal coating." In horizontal coating, one luminescent region receives ink droplets from multiple nozzles.

FIG. 4 shows a state where ink is applied to luminescent regions 12 by horizontal coating. As shown in FIG. 4, horizontal coating allows each luminescent region 12 to receive a uniform amount of ink even when the inkjet head includes nonfunctional nozzle 21$a$ and/or nozzle 21$b$ which discharges ink excessively.

Nevertheless, there is a problem even with the method shown in FIG. 3 that results in "uneven drying," which means unevenness in the state of organic functional layers due to uneven ink drying rates across the panel. The ink applied at lengthwise ends of a luminescent region (hereinafter simply referred to as "ends of a luminescent region" in some cases) generally dries faster than the ink applied at the lengthwise center of that luminescent region (hereinafter simply referred to as "center of a luminescent region" in some cases). This is because in a luminescent region the solvent vapor concentration is smaller around ends than around the center of the luminescent region.

The ink drying rate differences lead to variations in the state (e.g., thickness) of organic functional layers among pixels, which in turn causes possible unevenness in brightness or luminescent color.

In the case of linear luminescent regions (see e.g., Patent Document 6), the applied ink can migrate throughout the luminescent region. Thus, when the ink applied at either end of the luminescent region dries first, the liquid ink at the center of the luminescent region is pulled toward either end, resulting in a non-uniform thick organic functional layer within the luminescent region.

On the other hand, when banks are used to define sub pixels in luminescent regions (see, e.g., Patent Document 6), the applied ink cannot migrate throughout the luminescent region and, therefore, unevenness in the organic functional layer thickness across the luminescent region as described above can be avoided. However, as there still remains solvent vapor concentration differences over the substrate, ink drying rate differences occur and, consequently, it results in failure to achieve uniform organic functional layer thickness among pixels.

In order to solve the above problems associated with ink drying unevenness, technologies have been suggested in which functional layer formation regions—regions which are defined by banks and where functional layers are to be formed—at the periphery of the substrate are made large compared to those at the center side of the substrate (see e.g., Japanese Patent Application Laid-Open Nos. 2009-54395 and 2009-48830). In the organic EL display panels disclosed by these patent documents, the functional layer formation regions included in the luminescent regions positioned at the edges of the substrate all have the same size.

However, these technologies have met with limited success in overcoming the problems caused by ink drying unevenness.

It is therefore an object of the present invention to provide an organic EL display panel having organic functional layers of the uniform thickness and a method of manufacturing the same.

Means for Solving the Problem

The inventors have established that ink drying rates can be equalized by partitioning luminescent regions into specific sub regions and, with additional studies, completed the present invention.

A first aspect of the present invention relates to organic EL display panels below.

[1] An organic EL display panel including:
a substrate which includes a plurality of luminescent regions which are arranged side by side in a specific direction and run in parallel to one another;
a bank formed over the substrate, the bank defining a plurality of coating regions in each of the luminescent regions, the coating regions being aligned in a row along the long axis of the luminescent region; and
a pixel electrode provided in each of the coating regions, the pixel electrode having a long axis which is in parallel with the long axis of the luminescent region,
wherein, in each of the luminescent regions, the coating region positioned at a lengthwise end of the luminescent region is larger in size than the coating region positioned at a lengthwise center of the luminescent region.

[2] The organic EL display panel according to [1], wherein the coating regions monotonically decrease in size from the lengthwise ends to the lengthwise center of the luminescent regions.

[3] The organic EL display panel according to [1] or [2], wherein, in each of the luminescent regions, the number of the pixel electrodes in the coating region positioned at the lengthwise end of the luminescent region outnumbers the number of the pixel electrodes in the coating region positioned at the lengthwise center of the luminescent region.

[4] The organic EL display panel according to [1] or [2], wherein the coating regions include the same number of the pixel electrodes.

[5] The organic EL display panel according to any one of [1] to [4], wherein the average area of the coating regions in each of the luminescent regions positioned at both edges in the specific direction of the panel is larger than the average area of the coating regions in the luminescent region positioned at a center in the specific direction of the panel.

[6] The organic EL display panel according to any one of [1] to [5], wherein the coating region positioned at the lengthwise center of the luminescent region positioned at the end in the specific direction of the panel is larger than the coating region positioned at the lengthwise center of the luminescent region positioned at the center in the specific direction of the panel.

A second aspect of the present invention relates to methods of manufacturing an organic EL display panel below.

[7] A method of manufacturing an organic EL display panel including:
providing a TFT substrate, the TFT substrate including: a substrate which includes a plurality of luminescent regions which are arranged side by side in a specific direction and run in parallel to one another; a bank formed over the substrate, the bank defining a plurality of coating regions in each of the luminescent regions, the coating regions being aligned in a row along the long axis of the luminescent region; and a pixel electrode provided in each of the coating regions, the pixel electrode having a long axis which is in parallel with the long axis of the luminescent region;
placing an inkjet head over the periphery of the substrate where the luminescent regions are not provided and to which the length of the luminescent region positioned at an edge in the specific direction of the substrate is adjacent, the inkjet head including two or more nozzles arranged at a predetermined pitch and receiving an ink containing organic functional material; and
applying the ink to the coating regions from the nozzles while relatively moving the inkjet head with respect to the luminescent regions in a direction perpendicular to the long axes of the luminescent regions,
wherein, in each of the luminescent regions, the coating region positioned at a lengthwise end of the luminescent region is larger in size than the coating region positioned at a lengthwise center of the luminescent region.

[8] A method of manufacturing an organic EL display panel including:
providing a TFT substrate, the TFT substrate including: a substrate which includes a plurality of luminescent regions which are arranged side by side in a specific direction and run in parallel to one another; a bank formed over the substrate, the bank defining a plurality of coating regions in each of the luminescent regions, the coating regions being aligned in a row along the long axis of the luminescent region; and a pixel electrode provided in each of the coating regions, the pixel electrode having a long axis which is in parallel with the long axis of the luminescent region;

placing an inkjet head over the periphery of the substrate where the luminescent regions are not provided and to which the length of the luminescent region positioned at an edge in the specific direction of the substrate is adjacent, the inkjet head including two or more nozzles arranged at a predetermined pitch and receiving an ink containing organic functional material;

identifying the positions and the numbers of the nozzles which do not discharge the ink by discharging a predetermined amount of the ink from each of the nozzles to the periphery of the substrate where the luminescent regions are not provided;

setting the amount of the ink to be discharged from the nozzles positioned at either side of the identified nozzle; and applying the ink to the coating regions from the nozzles while relatively moving the inkjet head with respect to the luminescent regions in a direction perpendicular to the long axes of the luminescent regions, wherein, in each of the luminescent regions, the coating region positioned at a lengthwise end of the luminescent region is larger in size than the coating region positioned at a lengthwise center of the luminescent region.

Advantageous Effect of the Invention

A manufacturing method of an organic EL display panel of the present invention can produce organic functional layers of the uniform thickness among different pixels, allowing for manufacture of an organic EL display panel with no light emission unevenness.

Moreover, the manufacturing method can supply a required amount of ink to each coating region even when the inkjet head used includes a given number of nonfunctional nozzles. Thus, it is possible to improve manufacturing yields.

BEST MODE FOR CARRYING OUT THE INVENTION

1. Manufacturing Method of Organic EL Display Panel

A manufacturing method of an organic EL display panel according to an embodiment of the present invention includes 1) a first step of providing a TFT substrate to be provided with organic functional layers; and 2) a second step of applying an ink containing organic functional material onto the TFT substrate by inkjet printing, to form the organic functional layers.

1) First Step

Figure 13:
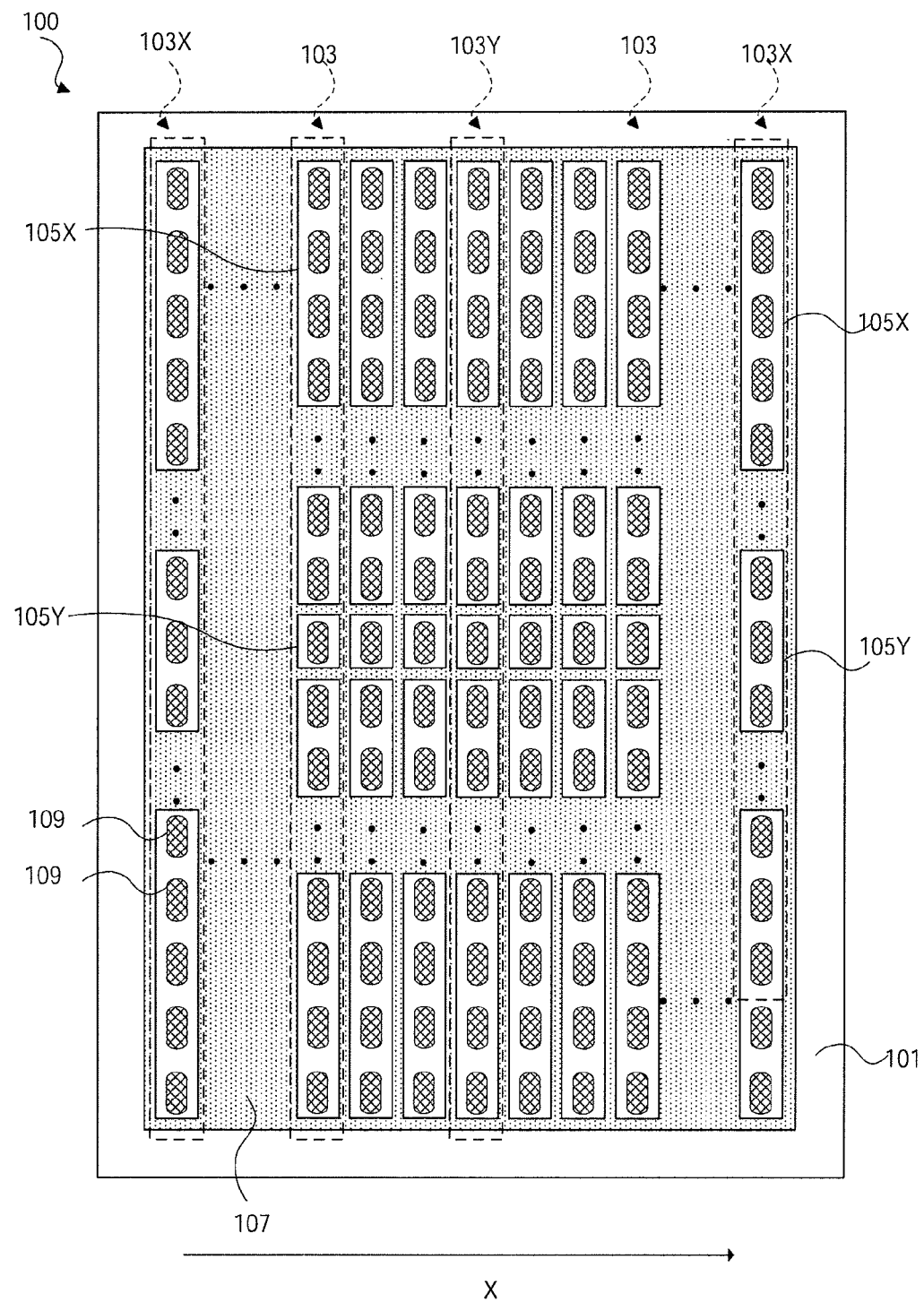
FIG. 13 is a plan view showing an organic EL display panel according to Embodiment 1.

In the first step, a TFT substrate to be provided with organic functional layers is provided (see FIG. 13). A feature of the present invention lies in the structure of a TFT substrate provided in the first step, as will be described in detail below.

The TFT substrate provided in the first step includes a substrate, a bank formed on the substrate, a matrix of pixel electrodes provided on the substrate, and thin film transistors (TFTs) respectively connected to the pixel electrodes. Each pixel electrodes has long and short axes.

Hole injection layers made of transition metal oxide may be formed over the respective pixel electrodes. Examples of transition metal oxides include $WO_x$ (tungsten oxides), $MoO_x$ (molybdenum oxides), $VO_x$ (vanadium oxides), and combinations thereof.

The substrate includes luminescent regions which are arranged side by side in a specific direction and run in parallel to one another. As used herein, the term "luminescent region" means a region in which red (R), green (G) or blue (B) sub pixels are arranged in a row (see reference numeral 103 in FIG. 13). Namely, in the present invention, there are provided three different color luminescent regions (red, green and blue) which are arranged side by side in a specific direction while running in parallel to one another. For example, a red luminescent region is placed next to a green luminescent region, a blue luminescent region is placed next to the green luminescent region, and another red luminescent region is placed next to the blue luminescent region. As described above, the luminescent regions each include a long axis which is in parallel with the long axis of the above-described pixel electrode. A feature of the present invention is that the luminescent region includes a plurality of coating regions arranged in a row.

A "bank" as used herein means a member for defining regions to which an ink containing organic functional material is to be applied. The bank is formed over the substrate. There is no particular limitation to the bank material as long as it is insulating and is easy to process.

The bank partitions one luminescent region into two or more coating regions, i.e., defines coating regions. As used herein, the term "coating region" means a region to which an ink containing organic functional material is to be applied. The organic functional material contains at least organic luminescent material and may further contain, for example, materials for hole injection layer and/or materials for hole transport layer. The bank defines two or more coating regions in one luminescent region in such a way that they are aligned in a row along the long axis of the luminescent region.

One or more pixel electrodes are provided in one coating region. When the coating region includes two or more pixel electrodes, the pixel electrodes are arranged in the coating region in a row along the long axis of the luminescent region.

A feature of the present invention lies in the relationship between the position and size of the coating regions. Specifically, the sizes of the coating regions vary from one area to another. The relationship between the position and size of the coating regions over a TFT substrate will be described in detail below.

(i) Relationship Between the Position and Size of Coating Regions in a Luminescent Region As described above, each luminescent region includes coating regions aligned in a row along the long axis of the luminescent region. According to the present invention, the coating region positioned at a lengthwise end (hereinafter referred to as "end coating region") is larger than the coating region positioned at the lengthwise center (hereinafter referred to as "center coating region") in every luminescent region (see FIGS. 13, 14 and 15). As used herein, the term "center coating region" means a coating region which includes a pixel electrode positioned at the lengthwise center of the luminescent region.

The end coating region may be made larger than the center coating region by, for example, making the length of the end coating region larger than that of the center coating region. In this case, the number of pixel electrodes arranged in the end coating region outnumbers that of pixel electrodes arranged in the center coating region (see FIG. 13). As used herein, the term "length of coating region" refers to a length of a coating region in the long axis direction of the luminescent region.

Figure 14:
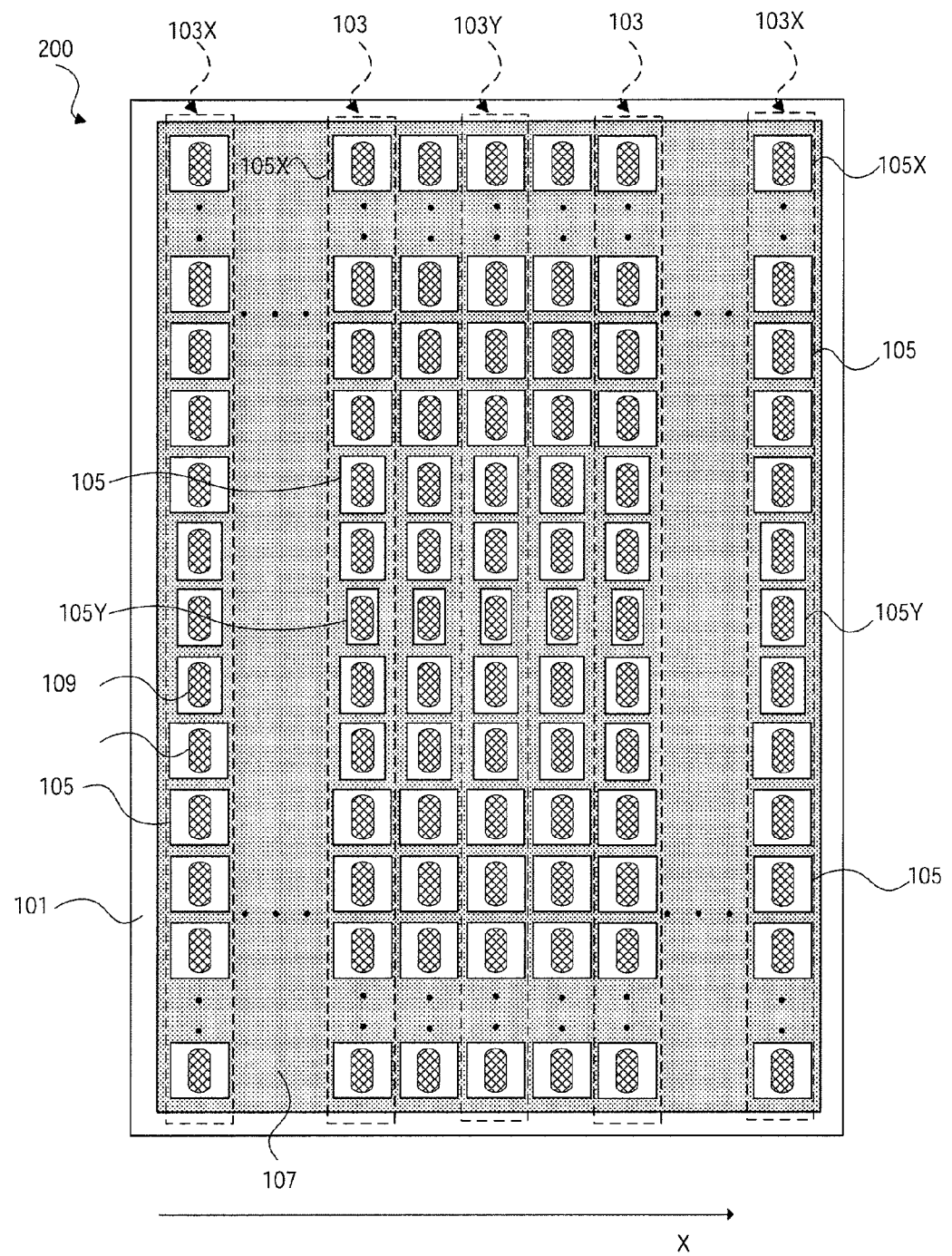
FIG. 14 is a plan view showing an organic EL display panel according to Embodiment 2.

Alternatively, the end coating region may be made larger than the center coating region by making the width of the end coating region larger than that of the center coating region while aligning them in length (see FIG. 14). In this case, the coating regions include the same number of pixel electrodes. As used herein, the term "width of a coating region" refers to a length of a coating region in perpendicular direction to the long axis of the luminescent region.

Further, the end coating region may be made larger in volume than the center coating region by making the height of the bank, which defines the end coating region, larger than the height of the bank defining the center coating region or by making the taper angle of the bank defining the end coating region smaller than the taper angle of the bank defining the center coating region (see FIGS. 16, 17A, 17B and 17C).

Preferably, coating regions monotonically decrease in size in the from the lengthwise end to the lengthwise center in the luminescent region. As used herein, "coating regions monotonically decrease in size from the lengthwise end to the lengthwise center in the luminescent region" means that coating regions at least do not show an increase in area from the end ones to the center one.

By making the end coating regions larger than the center coating region as described above, ink drying rates (described later) can be equalized across the luminescent region, thereby providing uniform thick organic functional layers in the luminescent region. The mechanism will be described in detail in the description for the second step described later.

(ii) Relationship Between the Position of Luminescent Regions Over the Substrate and the Size of Coating Regions Provided Therein As described above, the sizes of coating regions in a luminescent region of a TFT substrate are so adjusted as to make uniform the organic functional layers thickness across the luminescent region. In some embodiments of the present invention, the sizes of coating regions may be adjusted for each luminescent region. With this configuration, ink drying rates can be equalized among luminescent regions, and thus it is made possible to equalize the thicknesses of organic functional layers among the luminescent regions. More specifically, according to the present invention, the average area of the coating regions provided in a luminescent region positioned at both edges in a specific direction of an organic EL display panel (hereinafter referred to as an "edge luminescent region." See reference 103X in FIGS. 13, 14 and 15) is preferably greater than the average area of the coating regions provided in the luminescent region positioned at the center in the specific direction of the organic EL display panel (hereinafter referred to as a "center luminescent region." See reference 103Y in FIGS. 13, 14 and 15).

Figure 15:
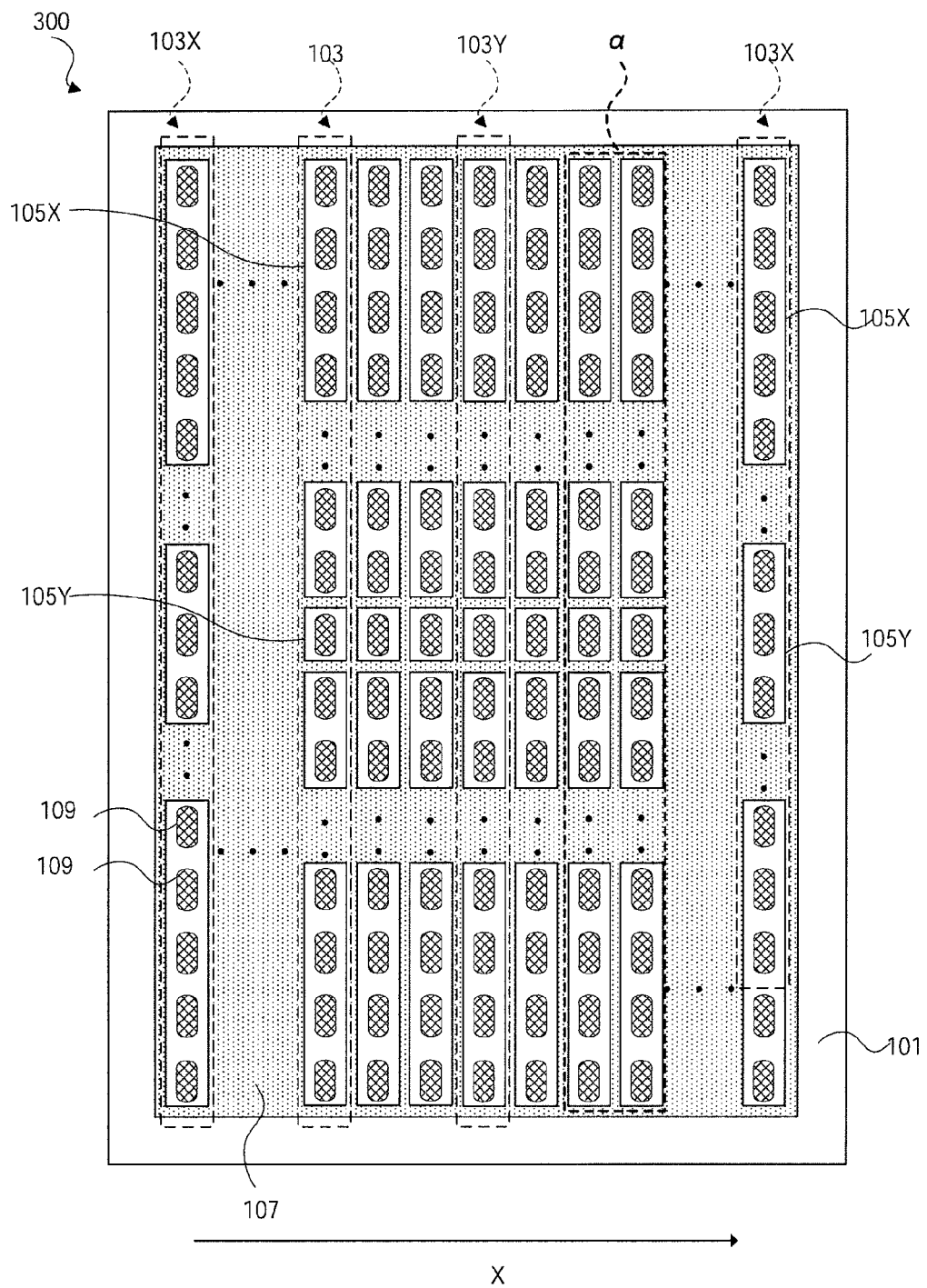
FIG. 15 is a plan view showing an organic EL display panel according to Embodiment 3.

The average area of the coating regions in the edge luminescent region may be made greater than that of the coating regions in the center luminescent region by, for example, reducing the number of the coating regions in the edge luminescent region compared with the center luminescent region (see FIGS. 13 and 15).

In addition, the center coating region of the edge luminescent region is preferably larger than the center coating region of the center luminescent region (see FIGS. 13, 14 and 15).

By making the average area of the coating regions in the center edge luminescent region greater than the average area of the coating regions in the center luminescent region, ink drying rates can be equalized among luminescent regions, and thus it is made possible to equalize the thicknesses of organic functional layers among the luminescent regions. Effects brought about by this will be described in detail in the following description for the second step.

2) Second Step

In the second step, an ink containing organic functional material (hereinafter may be simply referred to as an "ink") is applied onto the prepared TFT substrate by inkjet printing to form organic functional layers thereon.

Figure 1:
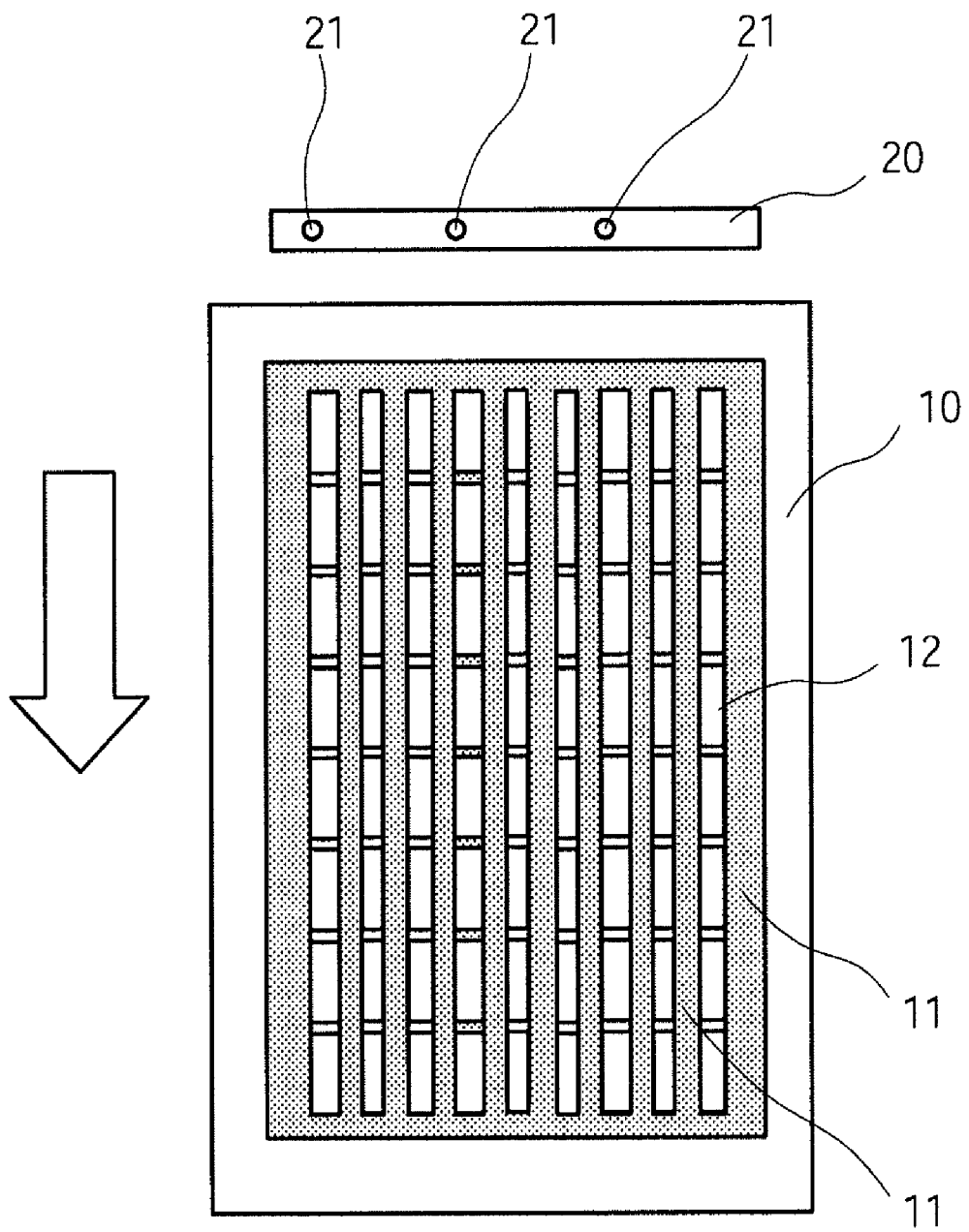
FIG. 1 shows a manufacturing method of an organic EL display panel by vertical coating.
Figure 2:
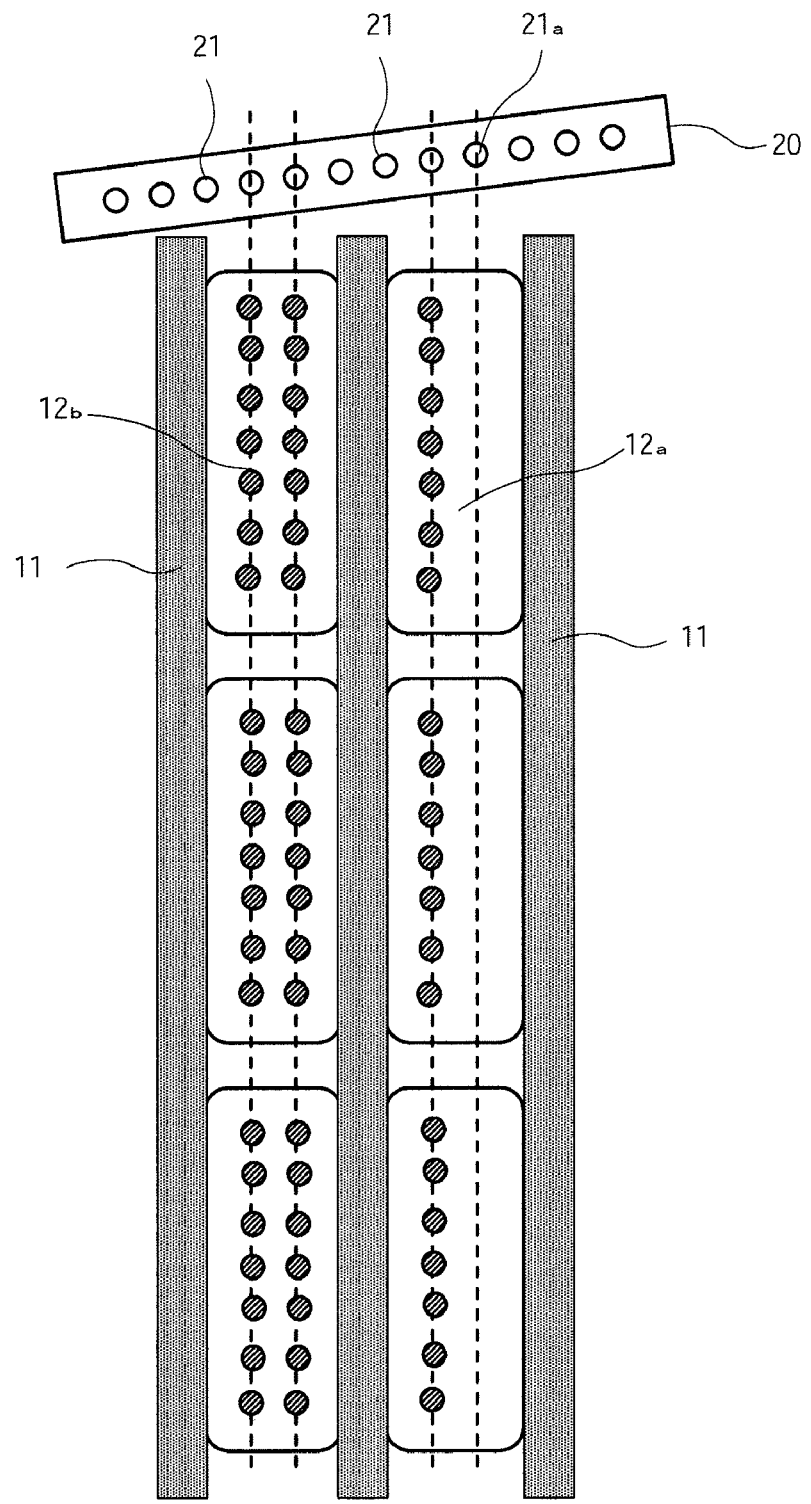
FIG. 2 shows a manufacturing method of an organic EL display panel by vertical coating.
Figure 3:
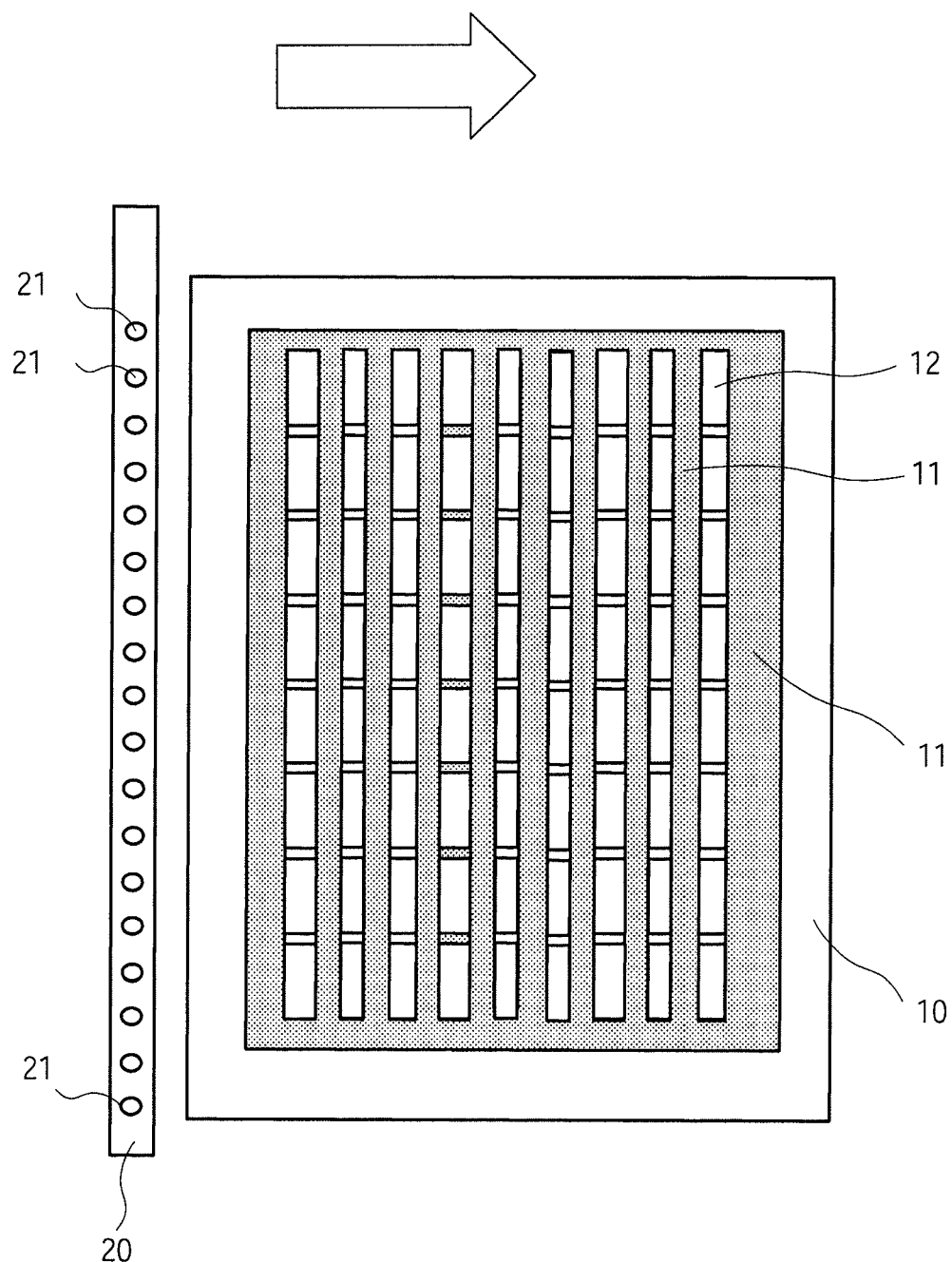
FIG. 3 shows a manufacturing method of an organic EL display panel by horizontal coating.
Figure 4:
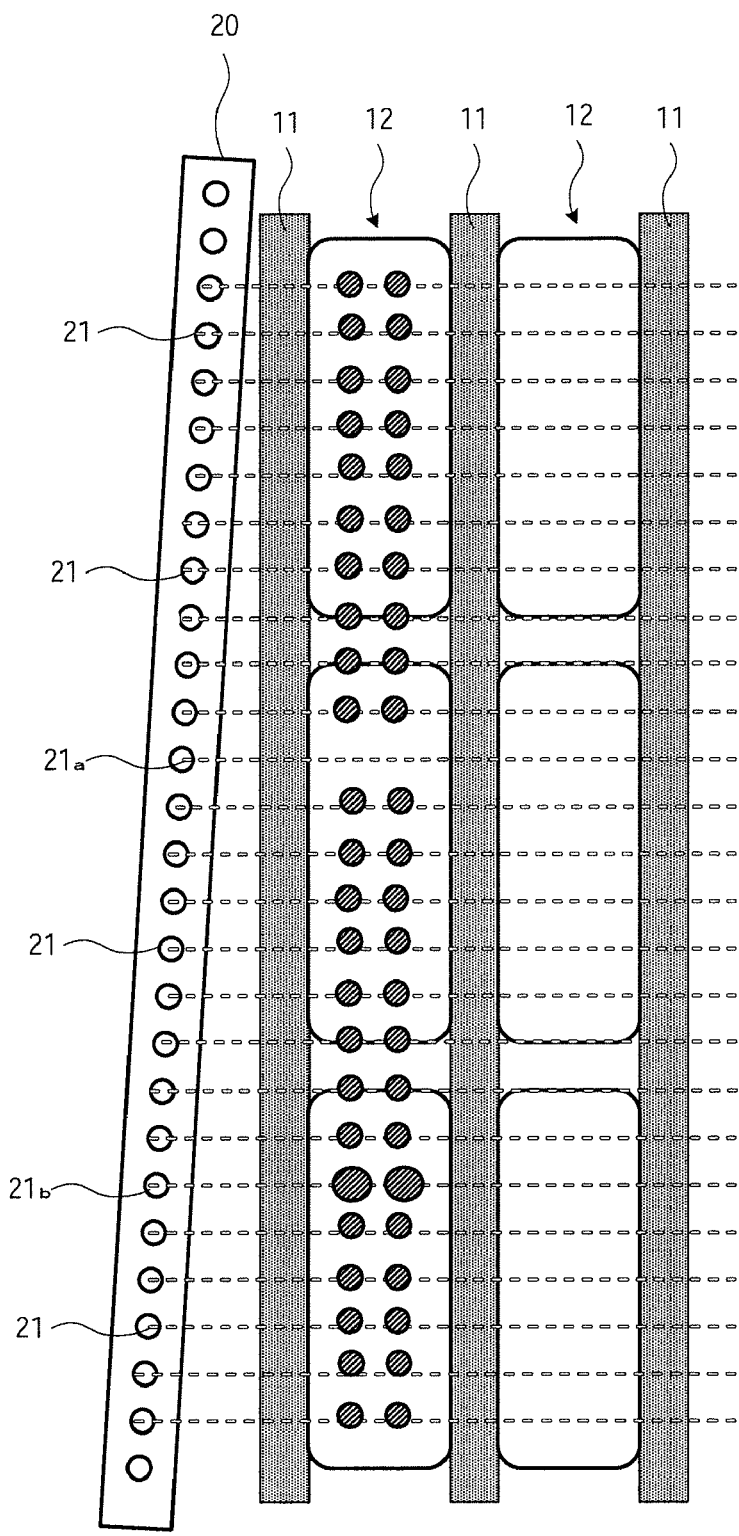
FIG. 4 shows a manufacturing method of an organic EL display panel by horizontal coating.

Ink application by inkjet printing technology may be accomplished by relatively moving an inkjet head which includes multiple nozzles, discharging ink droplets, across a TFT substrate. As described above, there are two different coating strategies according to the direction with respect to the luminescent regions, in which the inkjet heat is moved: vertical coating where the inkjet head is relatively moved in a direction parallel to the long axes of luminescent regions; and horizontal coating where the inkjet heat is relatively moved in a direction perpendicular to the long axes of the luminescent regions. In the present invention, horizontal coating is preferable because with horizontal coating, one coating region receives ink droplets from multiple nozzles, and therefore, thickness unevenness in the resultant organic functional layer can be avoided, which occurs due to the differences in ink discharge amount among different nozzles (see FIG. 4). A method of applying an ink over a TFT substrate by horizontal coating will be described with reference to the drawings.

The second step further includes i) placing an inkjet head, including multiple nozzles, over the periphery of the substrate where the luminescent regions are not provided and to which the length of the edge luminescent region is adjacent (see FIG. 5); ii) identifying the positions and numbers of nonfunctional nozzles by discharging ink droplets from the nozzles to the over the periphery of the substrate where the luminescent regions are not provided; iii) setting the amount of ink to be discharged from nozzles positioned at either side of the identified nonfunctional nozzle to a level higher than usual; and iv) applying ink droplets from the nozzles to coating regions while relatively moving the inkjet head in a direction perpendicular to the long axes of the coating regions (see FIGS. 6 to 10).

Figure 5:
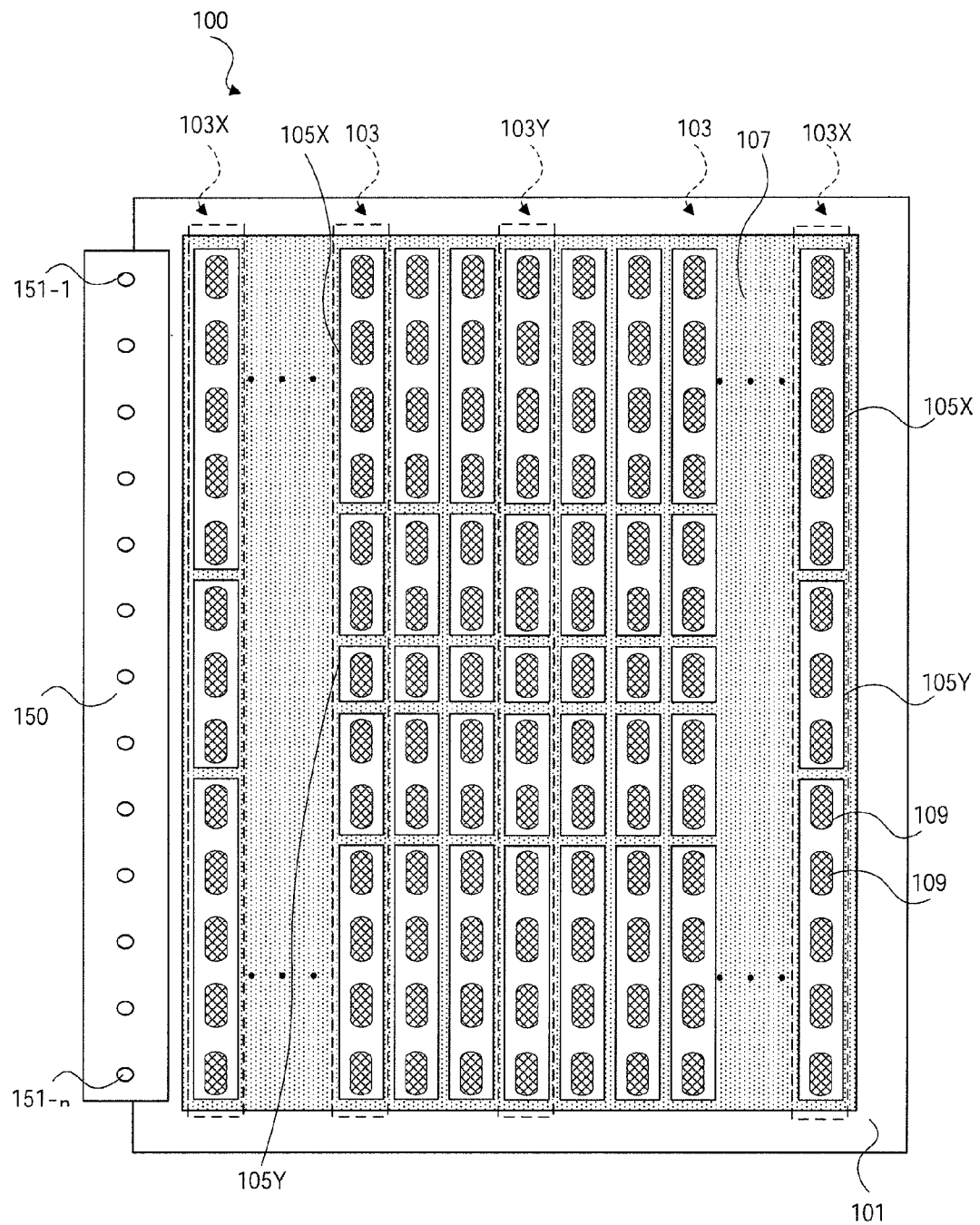
FIG. 5 shows a manufacturing method of an organic EL display according to an embodiment of the present invention.

FIG. 5 shows a state after conducting step i). In step i) an inkjet head is placed over the periphery of substrate 101 where the luminescent regions 103 are not provided and to which the length of edge luminescent region 103X is adjacent. More specifically, inkjet head 150 is placed above and to the side of edge luminescent region 103X, the outermost luminescent region of all luminescent regions. The direction in which nozzles 151 of the positioned inkjet head 150 are arranged may be in parallel with the long axes of luminescent regions 103 (see FIG. 5).

Regarding nozzles 151 (151-1 to 151-n) arranged along the length of inkjet head 150, the distance between nozzle 151-1 positioned at one end of inkjet head 150 and nozzle 151-n positioned at the other end preferably equals to or longer than the length of luminescent region 103 on substrate 101, as shown in FIG. 5. The reason for this is that ink can be applied to all of coating regions 105 of luminescent region 103 at a time. When the direction in which nozzles 151-1 are arranged is tilted with respect to the long axis of luminescent region 103, the component of the distance from nozzle 151-1 to nozzle 151-n along the length of luminescent region preferably equals to or longer than the length of luminescent region 103.

The interval (pitch) of nozzles 151 linearly arranged along inkjet head 150 is preferably 10-50 µm, e.g., about 20 µm, in order for ink droplets discharged from nozzles 151 to be joined together at their landing points. The volume of one ink droplet discharged from nozzle 151 is preferably 1-15 pl, e.g., 3 pl.

An ink containing organic functional material is supplied in the inkjet head. In the present invention it is preferable that the organic functional material contains polymeric organic luminescent material, which is appropriately selected so that each luminescent region shows color of interest (R, G or B).

In step ii), the positions and numbers of nozzles which failed ink discharge (such nozzles will be referred to as "nonfunctional nozzles") are identified by discharging predetermined amounts of ink from nozzles 151 to the periphery of substrate 101 having no luminescent regions 103. This can be achieved by observing ink droplets discharged from nozzles and landed on the substrate with a camera, to confirm which nozzles failed ink discharge.

When it is determined that the inkjet head includes a given number of nonfunctional nozzles, nozzle cleaning is performed without proceeding to step iii). For example, when it is determined that nonfunctional nozzles account for at least 2% of the total nozzles, the nozzles are cleaned by purging, wiping, etc. After nozzle cleaning, step ii) is repeated. On the other hand, when it is determined that nonfunctional nozzles account for not more than 2% of the total nozzles in step ii), the process proceeds to step iii).

Inkjet printing device nozzles are sometimes clogged due to ink drying at the nozzles ports or ink deposition. If the nozzles are clogged, the inkjet head should be cleaned, which causes work efficiency reduction. Also, it is difficult to remove all clogs from the inkjet head by cleaning. Accordingly, in fact, it is forced to perform ink application using an inkjet head which includes a given number of nonfunctional nozzles.

In step iii), the amount of ink to be discharged from the nozzles positioned at either side of each nonfunctional nozzle identified in step ii) is set higher than the "given amount" set in step ii). More specifically, the ink discharge interval (time interval between discharging one drop and the next) of the nozzles flanking the nonfunctional nozzle is reduced to ⅔ of the normal level. This allows these nozzles to discharge 1.5 times as large amount of ink as do normal nozzles per unit time. This approach cancels ink deficiency caused by the nonfunctional nozzle.

In this way, even when the nozzle head includes a given number of nonfunctional nozzles, steps ii) and iii) control ink discharge so that every coating region receives a required amount of ink. This prevents generation of non-coated coating regions in step iv), thereby leading to improved manufacturing yields.

Figure 6:
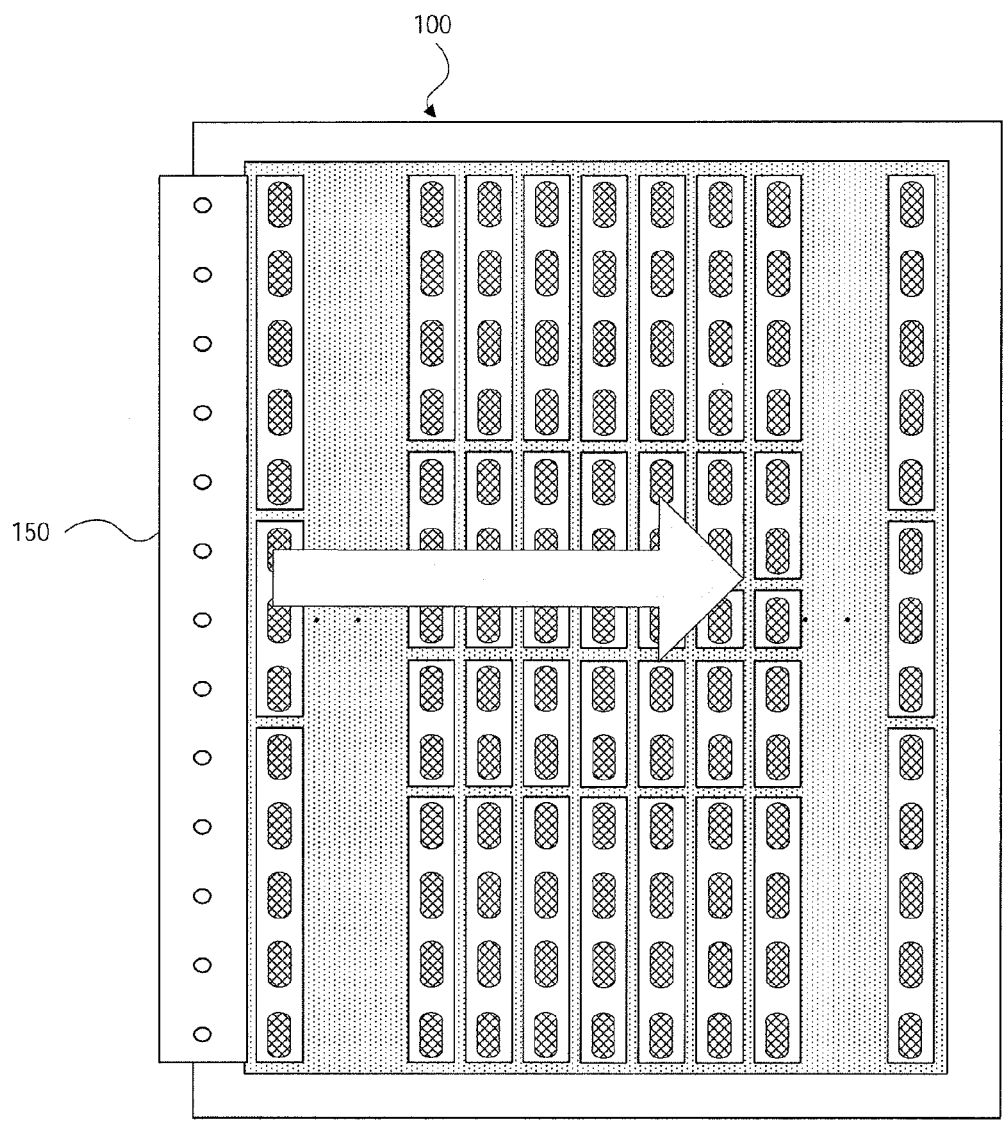
FIG. 6 shows a manufacturing method of an organic EL display according to an embodiment of the present invention.

FIGS. 6 to 9 illustrate how step iv) is conducted. In step iv) inkjet head 150 is relatively moved across TFT substrate 100 in a direction perpendicular to the long axes of luminescent regions 103 on TFT substrate 100 (FIG. 6). In order to realize relative movement of inkjet head 150 with respect to TFT substrate 100, either or both of inkjet head 150 and TFT substrate 100 may be moved. When nozzles 151 of inkjet head 150 have reached one of luminescent regions 103 as a result of relative movement of inkjet head 150 with respect to TFT substrate 100, ink droplets are discharged from nozzles 151.

As luminescent region 103 includes multiple coating regions 105 defined by bank 107, the discharged ink droplets land on and fill coating regions 105. Each sub pixel receives ink droplets in an amount of 100-500 pl. Each nozzle generally discharges multiple ink droplets per given time interval, supplying a required amount of ink.

Figure 7:
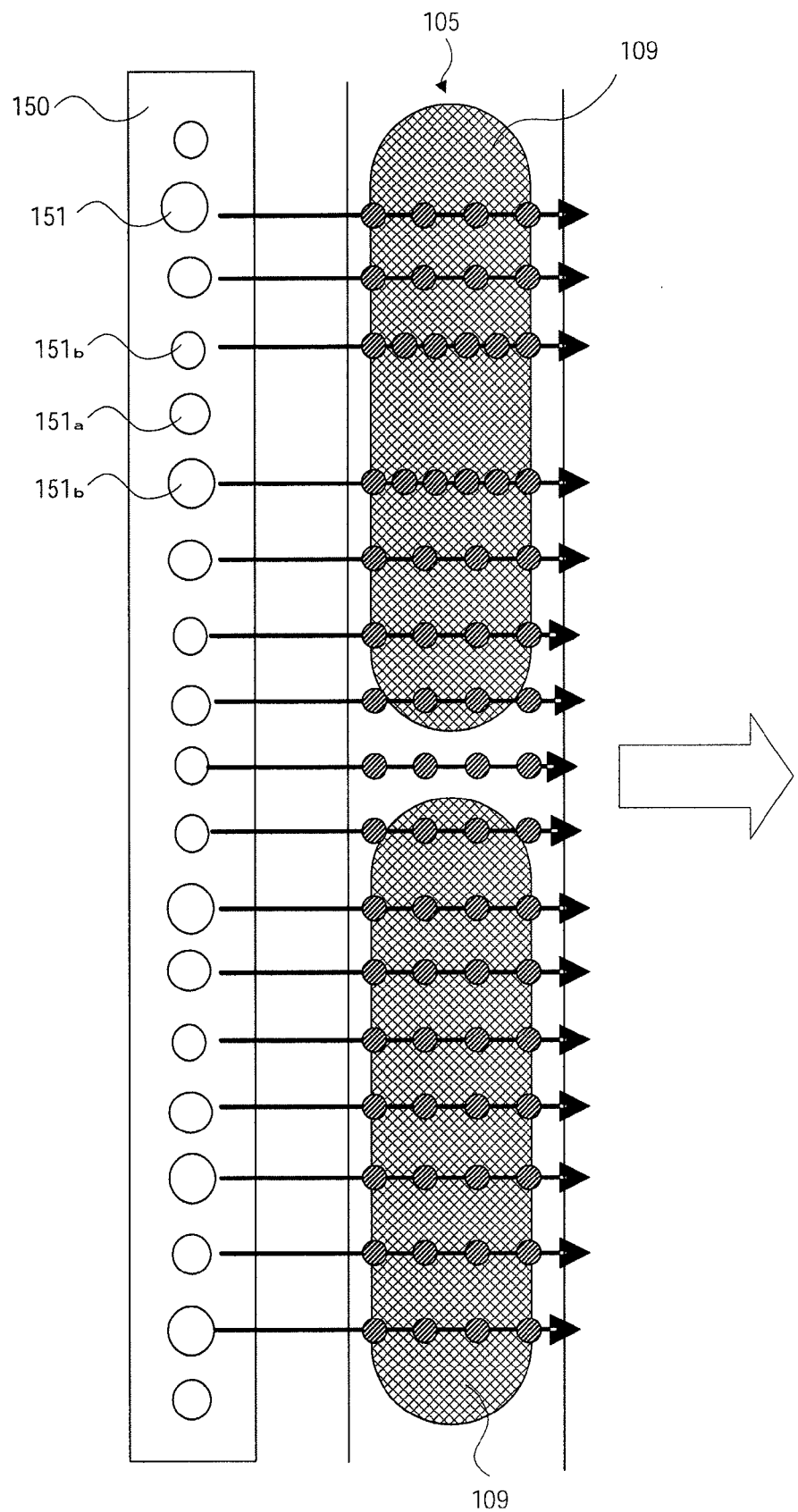
FIG. 7 shows a manufacturing method of an organic EL display according to an embodiment of the present invention.

FIG. 7 is a schematic illustration showing how nozzles 151 discharge ink droplets into coating regions 105. As shown in FIG. 7, each coating region 105 receives ink droplets from multiple nozzles 151.

Nozzle 151a shown in FIG. 7 is a nonfunctional nozzle which discharges no ink droplets. As described above, by step iii), nozzles 151b flanking nonfunctional nozzle 151a are so controlled that they discharge a larger amount of ink than usual in order to cancel ink deficiency caused by nozzle 151a. In FIG. 7, while normal nozzle 151 is shown to discharge 4 ink droplets in coating region 105, nozzles 151b flanking nonfunctional nozzle 151a are each shown to discharge 6 ink droplets. By increasing the amount of ink discharged from the nozzles flanking nonfunctional nozzles by a factor of 1.5 in this way, it is possible to apply a required amount of ink to every sub pixel even when the inkjet head includes such nonfunctional nozzles.

Although the amount of ink discharged from nozzles 151 of inkjet head 150 may vary from one nozzle to another, ink amounts can be equalized among luminescent regions by relatively moving the inkjet head in a direction perpendicular to the long axes of the luminescent regions, as in the present invention. Thus, even when discharge ink levels differ among nozzles 151, it results in uniform coat thickness among different luminescent regions.

Figure 8:
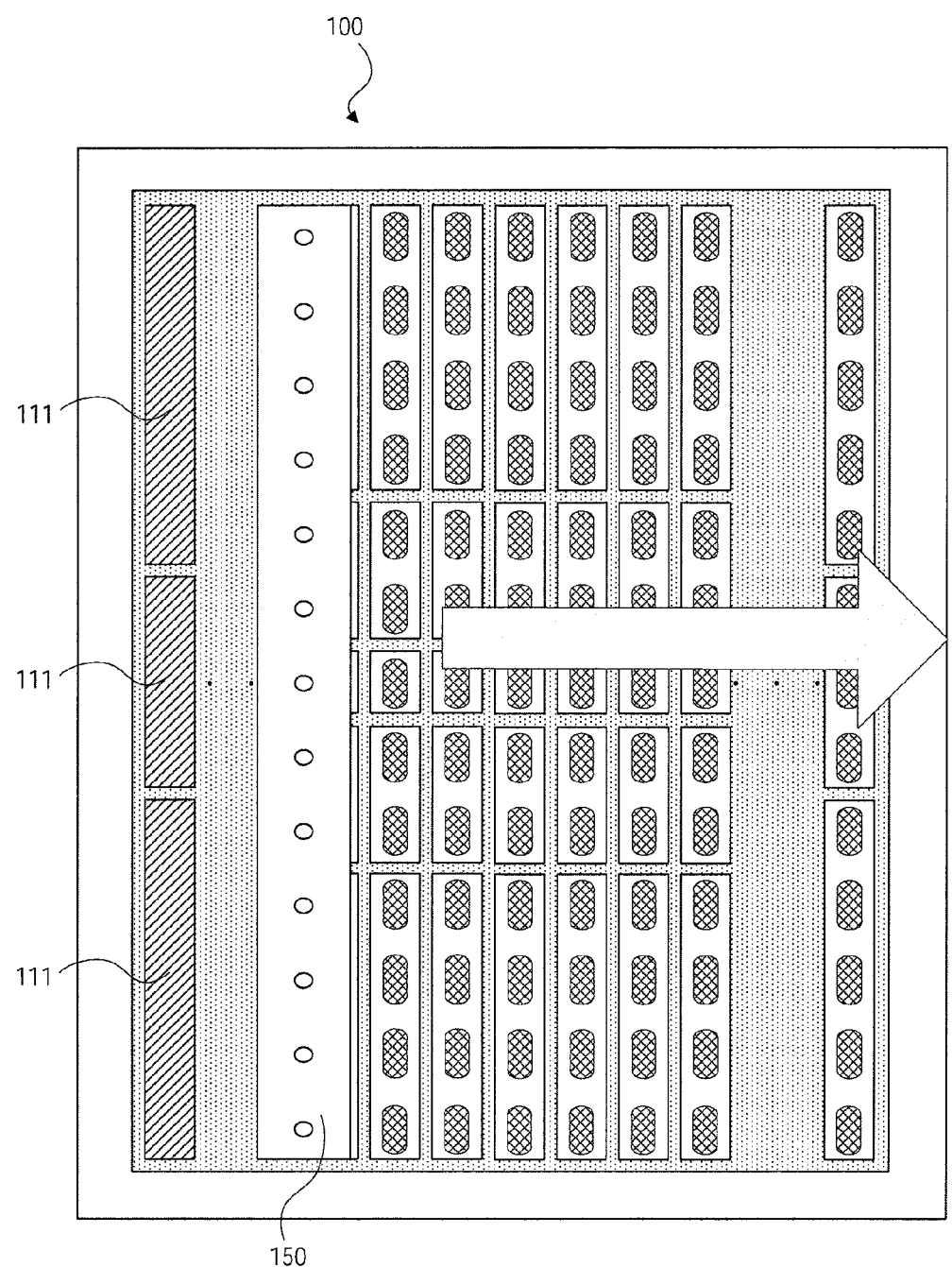
FIG. 8 shows a manufacturing method of an organic EL display according to an embodiment of the present invention.
Figure 9:
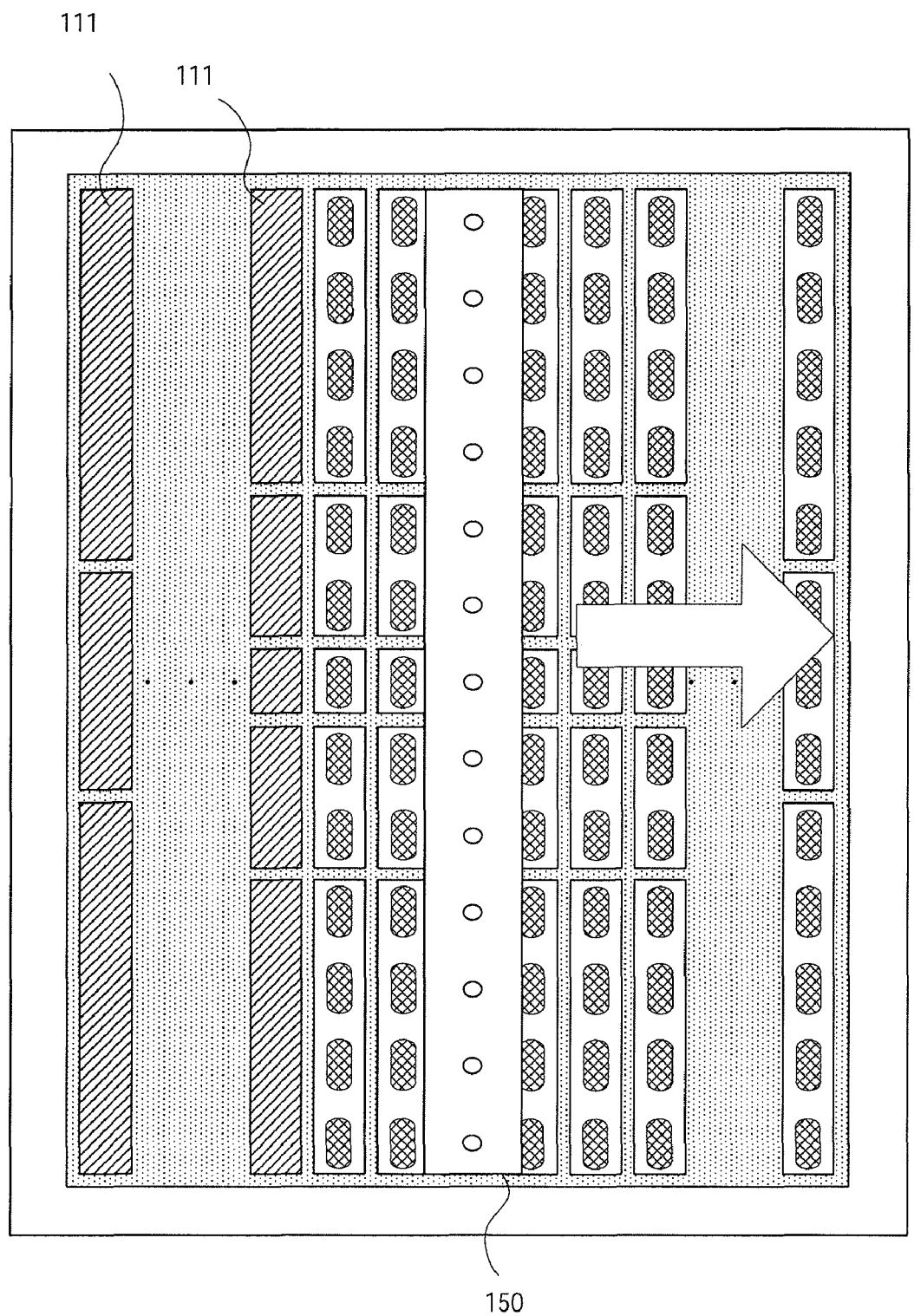
FIG. 9 shows a manufacturing method of an organic EL display according to an embodiment of the present invention.

After discharging ink droplets to respective coating regions 105 of one luminescent region 103, inkjet head 150 is further relatively moved to the next luminescent region 103 where ink droplets should be applied (see FIGS. 8 and 9). Because red (R) ink, green (G) ink and blue (B) ink are generally applied in different operations, the ink in question is applied every three linear regions. When inkjet head 150 has reached another intended luminescent region 103, ink droplets are again discharged to respective coating regions 105 of luminescent region 103. Subsequently, the other color inks are applied in the same way to finish application of three different color inks—red, green, and blue. In this way the inks are applied to all of coating regions 105, after which the inks are dried to form organic functional layers 111 (see FIG. 10).

In the present invention, the end coating regions are made larger than the center coating region as described above. It is thus possible to equalize ink drying rates in the coating regions in a luminescent region and thus to form a uniform thick organic functional layers across the luminescent region. Hereinafter, the relationship between making end coating regions larger than the center coating region and equalization of ink drying rates will be described.

Figure 10:
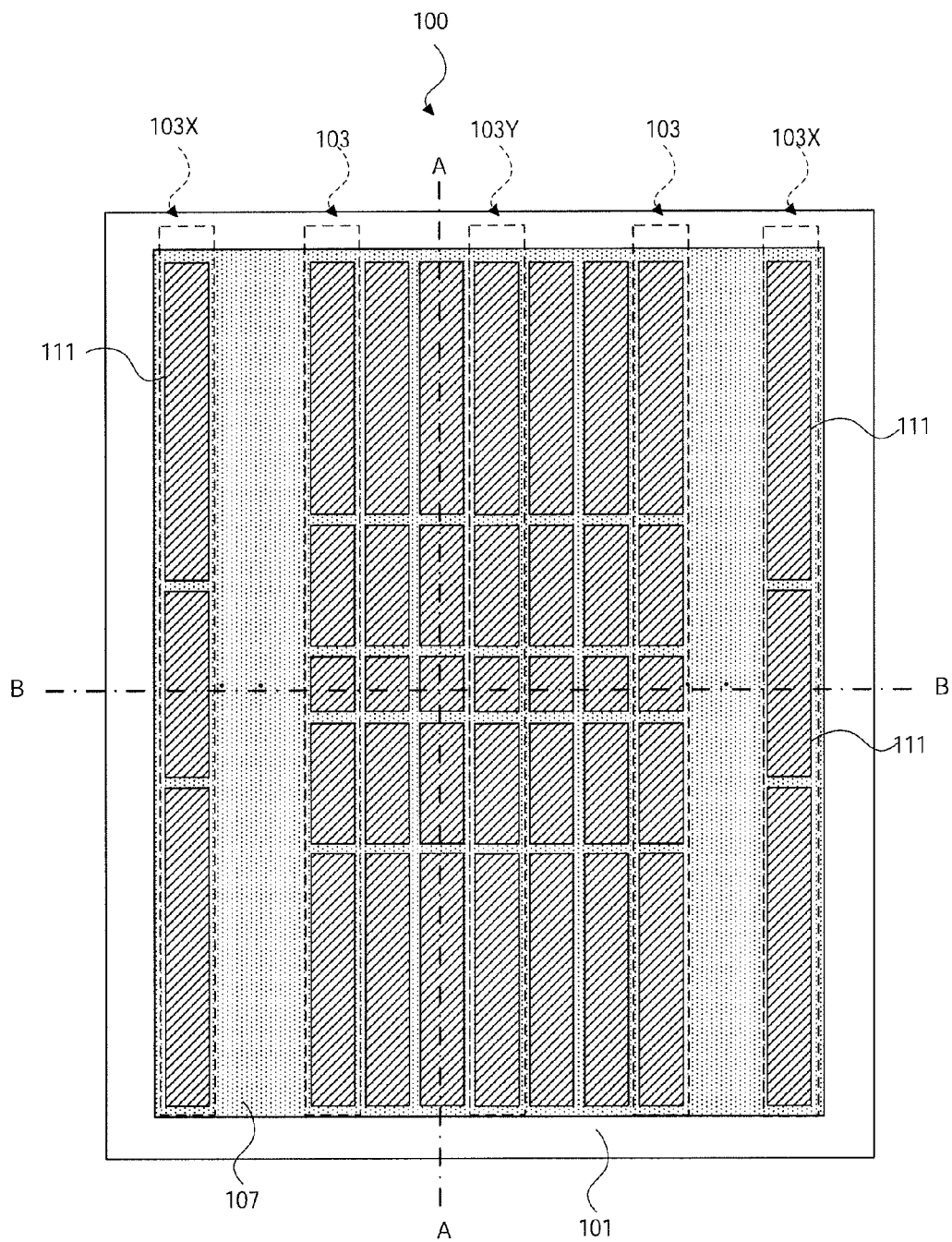
FIG. 10 is a plan view showing an organic EL display panel according to an embodiment of the present invention.
Figure 11:
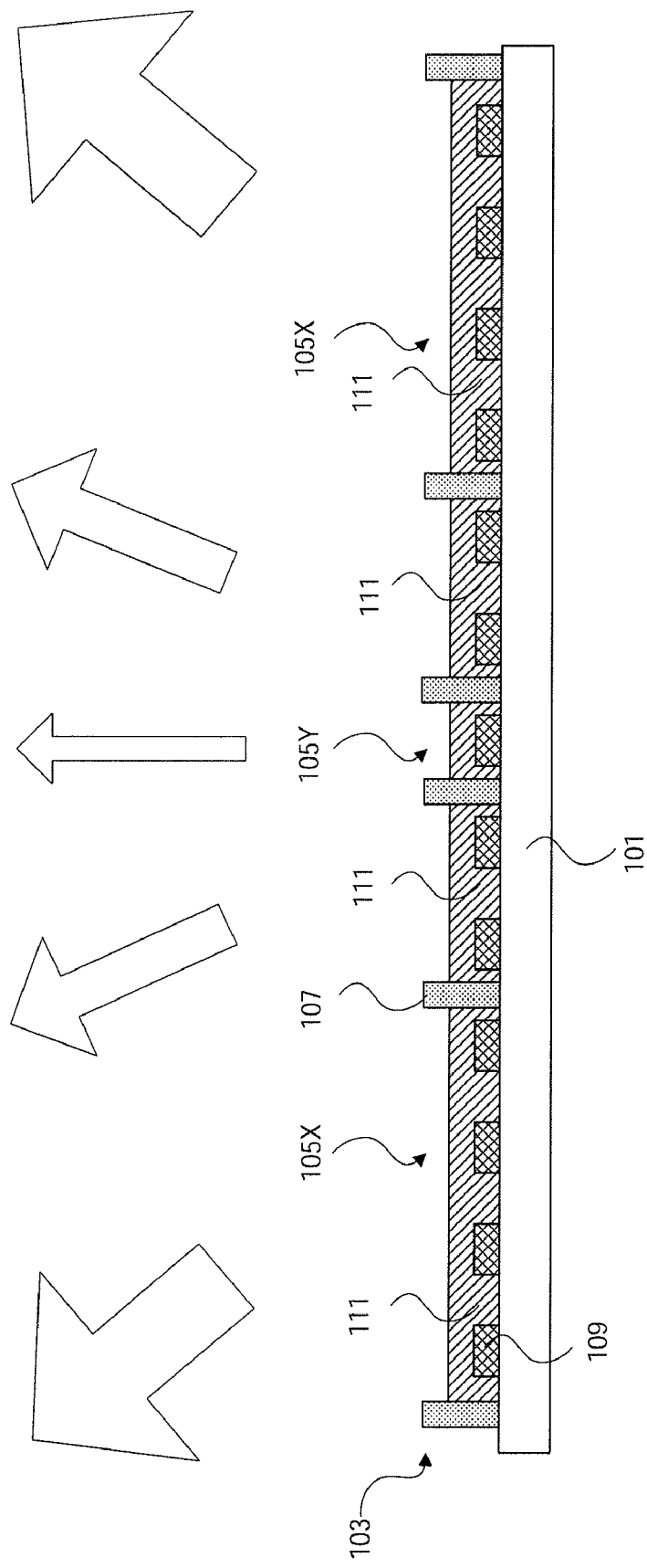
FIG. 11 is a cross-sectional view showing an organic EL display panel according to an embodiment of the present invention.

FIG. 11 is a cross-sectional view showing the TFT substrate of FIG. 10 taken along A-A line. The arrows in FIG. 11 represent ink evaporation rates; the thicker the arrow, the higher the ink evaporation rate.

As shown in FIG. 11. while ink evaporation rates are high around either end of luminescent region 103 due to low solvent vapor concentrations, ink evaporation rates are low around the center due to high solvent vapor concentrations.

As described above, in the present invention, end coating regions 105X are made larger than center coating region 105Y. Namely, end coating region 105X receives more ink than center coating region 105Y. Thus, even when ink evaporation rates are high at either end of luminescent region 103, it takes relatively long time before the ink applied to end coating regions 105X to completely dry because they receive large amounts of ink. On the other hand, although ink evaporation rates are low at the center of luminescent region 103, it takes relatively less time before the ink applied to center coating region 105Y to completely dry because it receives less ink.

It is thus possible to equalize ink drying rates of end coating regions and center coating region by making the end coating regions larger than the center coating region, thereby ensuring uniform thickness in the organic functional layers across a luminescent region.

In addition, as the average area of the coating regions contained in edge luminescent region 103X is larger than the average area of the coating regions contained in center luminescent region 103Y, ink drying rates are equalized among luminescent regions, providing organic functional layers of the uniform thickness among the luminescent regions.

Figure 12:
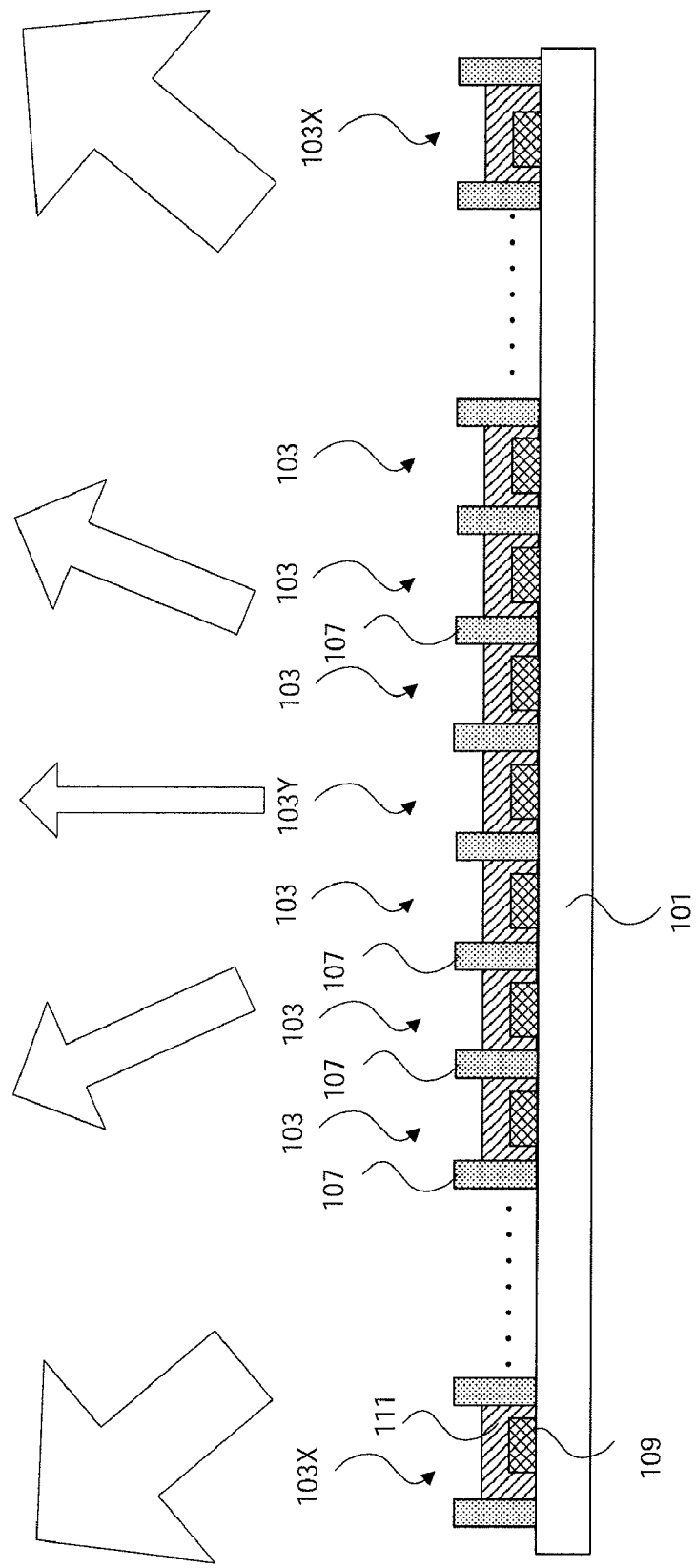
FIG. 12 is a cross-sectional view showing an organic EL display panel according to an embodiment of the present invention.

FIG. 12 is a cross-sectional view showing the TFT substrate of FIG. 10 cut along B-B line. The arrows in FIG. 12 represent ink evaporation rates; the thicker the arrow, the higher the ink evaporation rate.

As shown in FIG. 12, while ink evaporation rates are high around edge luminescent region 103X due to low solvent vapor concentrations, ink evaporation rates are low around center luminescent region 103Y due to high solvent vapor concentrations.

In the present invention, the average area of coating regions 105 contained in edge luminescent region 103X is larger than the average area of coating regions 105 contained in center luminescent region 103Y (see FIG. 10). Thus, even when ink evaporation rates are high around edge luminescent region 103X, it takes relatively long time before the ink applied to coating regions 105 contained in edge luminescent regions 103X to completely dry. On the other hand, although ink evaporation rates are low around center luminescent region 103Y, it takes relatively less time before the ink applied to coating regions 105 contained in center luminescent region 103Y to completely dry.

By making the average area of the coating regions contained in the edge luminescent region larger than the average area of the coating regions contained in the center luminescent region, it is made possible to equalize ink drying rates of the edge luminescent regions and center luminescent region and thus to provide organic functional layers of the uniform thickness among the luminescent regions, allowing for manufacture of an organic EL display panel with no light emission unevenness.

It is also possible to improve manufacturing yields by partitioning luminescent regions into multiple coating regions by a bank. It is often the case that unwanted dusts are attached to the inside of the luminescent regions before formation of organic functional layers therein. If the luminescent regions are not partitioned into multiple coating regions, the dusts attached to the inside of the luminescent regions absorb the applied ink, resulting in generation of voids in the luminescent regions. By contrast, when the luminescent regions are partitioned into multiple coating regions by a bank as in the present invention, the bank defining the coating regions prevents ink absorption by dusts. Thus, even when dusts are attached to the inside of the luminescent regions, formation of voids becomes less likely occur in the coating regions, thereby leading to improved manufacturing yields.

When hole injection layer is to be included as organic functional layer, it can be prepared by applying an ink which contains as a hole injection layer material PEDOT-PSS by inkjet printing in the same manner as described above prior to formation of organic luminescent layer.

Between formation of hole injection layer and formation of organic luminescent layer, hole transport layer may be formed by applying an polyaniline-based material by inkjet printing in the same preparation manner as described above.

After formation of organic EL layer, electron injection layer, a counter electrode, etc., are sequentially stacked, and in addition, a sealing film, a glass substrate, etc., are placed thereon to manufacture a display panel.

With a manufacturing method of an organic EL display panel of the present invention, it is possible to produce organic functional layers of the uniform thickness among different pixels and thus to manufacture an organic EL display panel with no light emission unevenness. In addition, even when an inkjet head is used which includes a given number of nonfunctional nozzles, it is possible to apply a required amount of ink to all coating regions, thereby leading to improved manufacturing yields.

2. Organic EL Display Panel

An organic EL display panel according to an embodiment of the present invention includes a substrate, a bank formed on the substrate, and a matrix of pixel electrodes provided on the substrate. Each pixel electrode has long and short axes.

Pixel electrodes are conductive members arranged on a substrate. They generally function as an anode, but may function as a cathode. Hole injection layers made of transition metal oxide may be formed over the respective pixel electrodes. Examples of transition metal oxides include $WO_x$ (tungsten oxides), $MoO_x$ (molybdenum oxides), $VO_x$ (vanadium oxides), and combinations thereof.

The hole injection layers made of transition metal oxide may be formed for respective sub pixels. Alternatively, one hole injection layer may be shared by multiple sub pixels. Preferably, however, the hole injection layers are provided for respective sub pixels.

The substrate may include thin film transistors (TFTs) respectively connected to the pixel electrodes.

The substrate includes luminescent regions which are arranged side by side in a specific direction and run in parallel to one another. Each luminescent region has a long axis which is in parallel with the long axis of the pixel electrode.

The substrate material varies depending on whether the organic EL display panel is of bottom-emission type or top-emission type. For example, the substrate needs to be insulating and transparent in the case of bottom-emission type. Accordingly, in the case of bottom-emission type, the substrate material may be glass, transparent resin, etc. In the case of top-emission type, on the other hand, transparency is not required; therefore, any insulating material suffices.

The bank partitions a luminescent region into multiple coating regions, i.e., define coating regions. The bank defines coating regions in one luminescent region in such a way that the coating regions are linearly arranged along the long axis of the luminescent region. Examples of the bank material include insulating resins such as polyimides. The bank height (distance from bank bottom surface to bank top surface) is 0.1-2 μm, most preferably 0.8-1.2 μm. When the bank height is greater than 2 μm, there is concern that the counter electrode (later described) is divided by the bank. When the bank height is less than 0.8 μm, there is concern that the ink applied in the coating regions defined by the bank leaks from the coating regions. Moreover, the bank is preferably forwardly tapered in section (see FIGS. 17A, 17B and 17C).

The end coating region may be made larger in volume than the center coating region by making the height of the bank, which defines the end coating region, larger than the height of the bank defining the center coating region or by making the taper angle of the bank defining the end coating region smaller than the taper angle of the bank defining the center coating region (see Embodiment 3).

One or more pixel electrodes are provided in one coating region. When the coating region includes two or more pixel electrodes, the pixel electrodes are arranged in the coating region in a row along the long axis of the luminescent region. Preferably, the pixel electrode is 220-390 μm in long axis and 70-125 μm in short axis.

The pixel electrode material varies depending on whether the organic EL display panel is of bottom-emission type or top-emission type. In the case of bottom-emission type, the pixel electrodes need to be transparent; therefore, examples of the pixel electrode material include indium tin oxide (ITO), indium zinc oxide (IZO), and zinc oxide (ZnO).

In the case of top-emission type, the pixel electrodes need to have light reflectivity. Thus, examples of the pixel electrode material include silver-containing alloys, more specifically silver-palladium-copper alloys (also referred to as "APC") and silver-ruthenium-gold alloys (also referred to as "ARA"); molybdenum/chrome (MoCr) alloys; nickel/chrome (NiCr) alloys; and aluminum alloys such as aluminum-neodymium (Al—Nd) alloys.

A feature of an organic EL display panel of the present invention lies in the relationship between the position and size of coating regions. Hereinafter, the relationship between the position and size of coating regions in the organic EL display panel will be described.

(1) Relationship Between the Position and Size of Coating Regions in a Luminescent Region In the organic EL display panel of the present invention, end coating regions are larger than the center coating region in every luminescent region. Preferably, the coating regions monotonically decrease in size from the end coating regions to the center coating region. In order to make the end coating regions larger than the center coating region, for example, the end coating regions may be made longer in length than the center region. In this case, the number of pixel electrodes arranged in the end coating region outnumbers that of pixel electrodes in the center coating region (see FIG. 13). For example, in a luminescent region, the number of pixel electrodes in one of the end coating regions may be so adjusted that they account for 0.5-15% of the total number of pixel electrodes in the luminescent region, and the number of pixel electrodes in the center coating region may be so adjusted that they account for 0.2-1.5% of the total number of pixel electrodes in the luminescent region.

The specific number of pixel electrodes of each of the end coating region and center coating region varies depending on the size of the organic EL display panel. For example, when manufacturing a 20-inch (1366×768 pixels) organic EL display panel, the number of pixel electrodes in the end coating region may be set to 5-100, and the number of pixel electrodes in the center coating region may be set to 2-10.

Alternatively, the end coating region may be made larger than the center coating region by making the width of the end coating region larger than that of the center coating region while aligning them in length (see FIG. 14). For example, the end coating region may be set to 60-90 μm in width, and the center coating region may be set to 50-70 μm in width. In this case, the end coating region and center coating region include the same number of pixel electrodes (see FIG. 14).

(2) Relationship Between the Position of Luminescent Regions and Size of Coating Regions Therein In an organic EL display panel of the present invention, it is preferable that the average area of the coating regions in both edge luminescent regions be larger than the average area of the coating regions in the center luminescent region.

In order to make the average area of the coating regions in the edge luminescent region larger than the average area of the coating regions in the center luminescent region, for example, the number of the coating regions in the edge luminescent region may be reduced compared to the number of the coating regions in the center luminescent region (see FIG. 13).

Moreover, the center coating region of the edge luminescent region is preferably larger than the center coating region of the center luminescent region (see FIGS. 13 and 14).

By differentiating the sizes of coating regions according to their position in this way, ink drying rates at the coating regions on the substrate can be equalized. Thus, it is possible to produce an organic EL display panel having organic functional layers having uniform thickness among different pixels.

An organic functional layer is provided over a pixel electrode. The organic functional layer is formed by coating method in a coating region defined by a bank and includes at least an organic luminescent layer.

The organic luminescent layer included in the organic functional layer contains organic luminescent material which may be either of polymer material or low molecular weight material. It is preferable to employ polymeric organic EL materials because it allows the organic luminescent layer to be readily formed by coating method. Examples of the polymeric organic EL materials include polyphenylenevinylene and its derivatives, polyacetylene and its derivatives, polyphenylene and its derivatives, poly para phenylene ethylene and its derivatives, poly(3-hexylthiophene) (P3HT) and its derivatives, and polyfluorene (PF) and its derivatives.

The organic functional layer may further include a hole injection layer, a hole transport layer and the like.

When the organic functional layer includes a hole injection layer, hole injection layer material is selected from, for example, poly(3,4-ethylenedioxythiophene) doped with polystyrenesulfonate (abbreviated as "PEDOT-PSS") and its derivatives (e.g., copolymers).

The hole transport layer prevents transportation of electrons to the hole injection layer, and helps efficient transportation of holes to the organic functional layer, and so forth. The hole transport layer is provided between a pixel electrode (or hole injection layer) and an organic functional layer. Examples of hole transport layer material include polyaniline. The hole transport layer is generally 10-100 nm in thickness, and may be about 40 nm in thickness.

An organic EL display panel of the present invention includes a counter electrode over organic functional layers. The counter electrode is a conductive member provided over the organic functional layers and generally functions as an cathode, but may function as a anode. The counter electrode material varies depending on whether the organic EL display panel is of bottom-emission type or top-emission type. In the case of top-emission type, the counter electrode needs to be transparent, and therefore, ITO, IZO or the like is employed as the counter electrode material. In the case of bottom-emission type, on the other hand, the counter electrode needs not to be transparent; therefore, any insulating material suffices. It is only necessary for the counter electrode to be provided over the organic functional layer so as to cover respective sub pixel regions, but it may be provided over all of the luminescent regions.

The organic EL display panel may be sealed by further providing a cover member at the side to which a counter electrode is attached. The cover member prevents possible entry of moisture or oxygen.

Embodiments of the present invention will be described below with references to the drawings.

Embodiment 1

This embodiment describes an example where in every luminescent region the end coating regions are longer in length than the center coating region along the long axis of the luminescent region. More specifically, this embodiment describes an example where the number of pixel electrodes in the end coating region outnumbers that of pixel electrodes in the center coating region.

FIG. 13 illustrates an organic EL display panel (TFT substrate) according to Embodiment 1 without a counter electrode. This display panel corresponds to the display panel (TFT substrate) of FIG. 10 without organic functional layers 111.

As shown in FIG. 13, TFT substrate 100 according to this embodiment includes substrate 101, bank 107, and pixel electrodes 109.

Substrate 101 includes luminescent regions 103 which are arranged side by side in X direction and run in parallel to one another.

Bank 107 partitions each luminescent region 103 into multiple coating regions 105, i.e., defines coating regions 105 in each luminescent region 103. Coating regions 105 are aligned in a row along the long axis of luminescent region 103.

One or more pixel electrodes 109 are arranged in coating region 105. The number of pixel electrodes 109 varies depending on the positions of coating regions 105. For example, in center luminescent region 103Y, end coating regions 105X each include 4 pixel electrodes 109, and center coating region 105Y includes one pixel electrode 109. Additional coating regions 105 which are of the same size as end coating region 105X (i.e., have 4 pixel electrodes) may be provided between center coating region 105Y and end coating region 105X. In this case, in one luminescent region 103, the total number of pixel electrodes 109 in the two end coating regions 105X plus pixel electrodes 109 in additional coating regions 105 accounts for 50-95% of the total number of pixel electrodes 109 in that luminescent region 103, and the number of pixel electrodes 109 in center coating region 105Y accounts for 10% or less of the total number of pixel electrodes 109 in that luminescent region 103. End coating regions 105X in edge luminescent region 103X each include 5 pixel electrodes, and center coating region 105Y in edge luminescent region 103X include 3 pixel electrodes. Thus, the average area of coating regions 105 in edge luminescent region 103X is larger than the average area of coating regions 105 in center luminescent region 103Y.

In this way, in this embodiment, ink drying rates in respective coating regions can be equalized by differentiating the sizes and positions of the coating regions on the substrate. It is thus possible to produce an organic EL display panel having uniform organic functional layers of the same thickness among pixels.

Embodiment 2

In Embodiment 1 an example has been described where the end coating regions are longer than the center coating regions. Embodiment 2 describes an example where in every luminescent region coating regions are of the same length, but the end coating regions are wider than the center coating regions. More specifically, Embodiment 2 describes an example where every coating region includes the same number of pixel electrodes.

FIG. 14 illustrates an organic EL display panel (TFT substrate) according to this embodiment without a counter electrode and organic functional layers.

As shown in FIG. 14, TFT substrate 200 according to this embodiment include substrate 101, bank 107, and pixel electrodes 109.

Substrate 101 includes luminescent regions 103 which are arranged side by side in X direction and run in parallel to one another.

Bank 107 partitions each luminescent region 103 into multiple coating regions 105, i.e., defines coating regions 105 in each luminescent region 103. Coating regions 105 are aligned in a row along the long axis of the luminescent region 103.

The sizes of coating regions 105 vary depending on their position. For example, end coating regions 105X are wider and larger than center coating regions 105Y. Moreover, in edge luminescent region 103X, end coating regions 105X are wider and larger than center coating region 105Y.

While edge luminescent region 103X includes 5 largest coating regions 105, center luminescent region 103Y includes only 4 largest coating regions 105. Moreover, center coating region 105Y in edge luminescent region 103X is larger than center coating region 105Y in center luminescent region 103Y. Thus, the average area of coating regions 105 in edge luminescent region 103X is larger than the average area of the coating regions 105 in center luminescent region 103Y.

In this embodiment an example has been described where each coating region 105 includes one pixel electrode 109; however, each coating region 105 may include more than one pixel electrode.

In this way, in this embodiment, ink drying rates in respective coating regions can be equalized by differentiating the sizes of the coating regions depending on their position. It is thus possible to produce an organic EL display panel having uniform organic functional layers of the same thickness among pixels.

Embodiment 3

This embodiment describes an organic EL display panel where the bank taper angle varies depending on the position on the panel.

Figure 16:
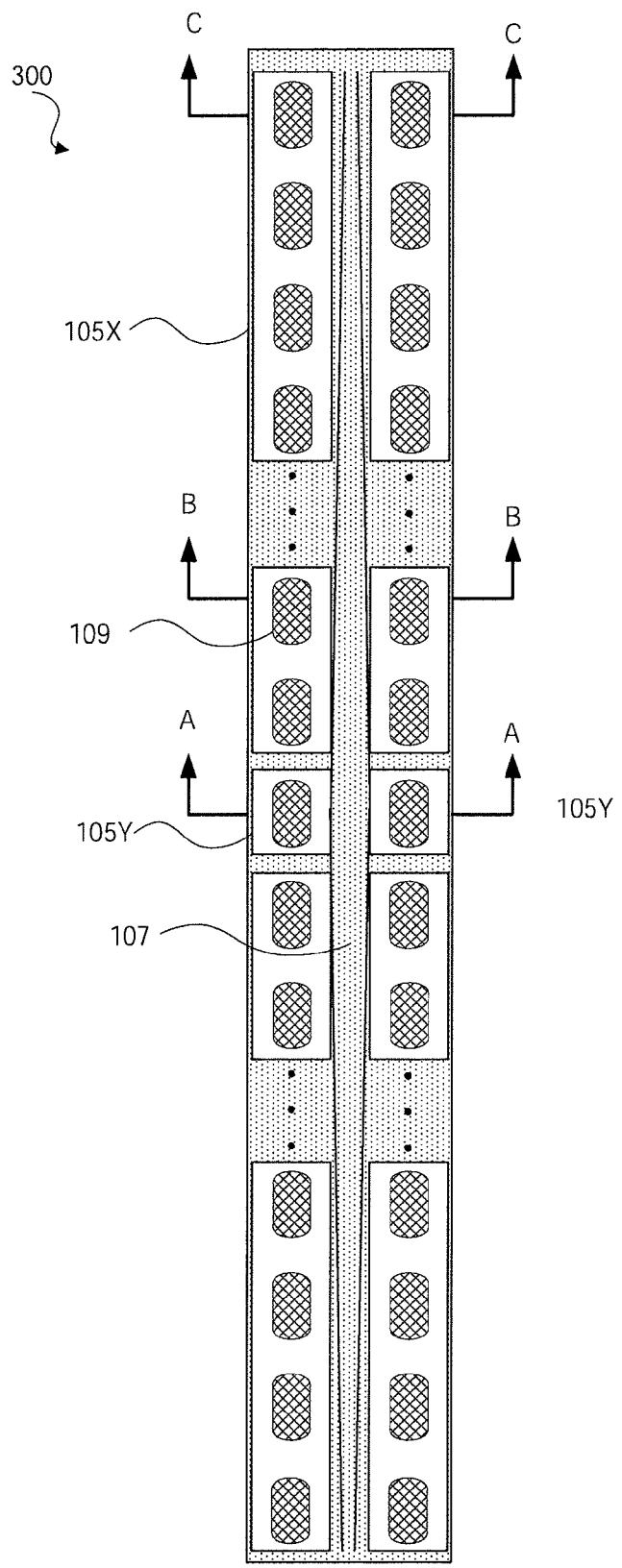
FIG. 16 is an partially enlarged view showing an organic EL display panel according to Embodiment 3.

FIG. 15 is a plan view showing organic EL display panel 300 (TFT substrate) according to Embodiment 3 without a counter electrode and organic functional layers. FIG. 16 is an enlarged view of the area enclosed by square a in FIG. 15.

Figure 17A:
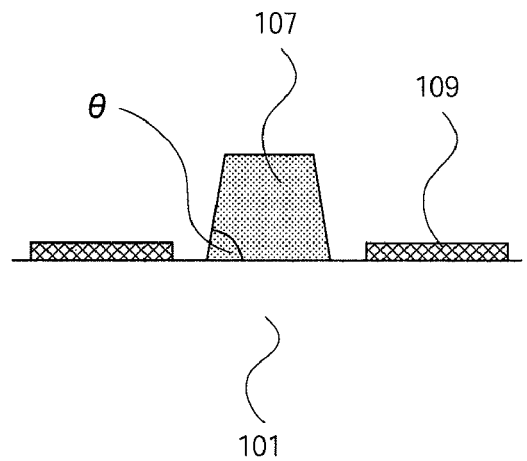
FIGS. 17A to 17C are cross-sectional views showing an organic EL display panel according to Embodiment 3.
Figure 17B:
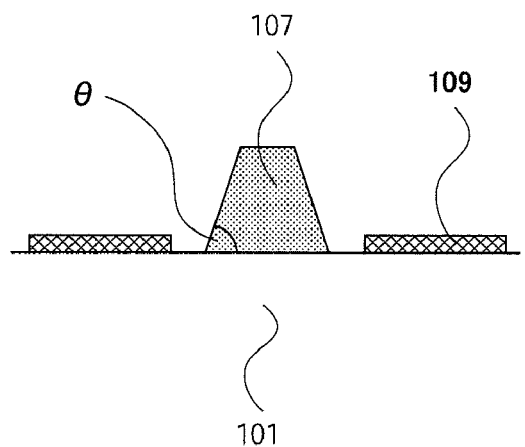
Figure 17C:
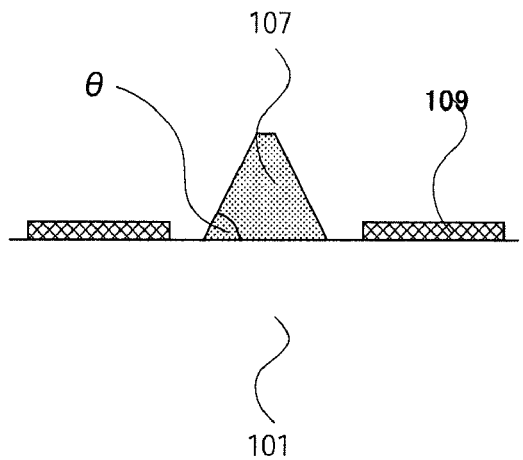

FIG. 17A is a cross-sectional view showing organic EL display panel 300 of FIG. 16 taken along A-A line. Specifically, FIG. 17A shows a cross section of bank 107 which defines center coating region 105Y. FIG. 17B is a cross-sectional view showing organic EL display panel 300 of FIG. 16 taken along B-B line. FIG. 17C is a cross-sectional view showing organic EL display panel 300 of FIG. 16 taken along C-C line. Specifically, FIG. 17C shows a section of bank 107 which defines end coating region 105X.

Organic EL display panel 300 according to Embodiment 3 is identical to organic EL display panel 100 according to Embodiment 1 except that the bank taper angle varies depending on the position on the organic EL display panel. The same components as those of organic EL display panel 100 according to Embodiment 1 are given the same reference numerals and are not described herein.

As shown in FIGS. 17A to 17C, bank 107 according to this embodiment has forward tapered shape.

An additional feature of this embodiment is that the taper angle θ of bank 107 varies. More specifically, portions of bank 107 defining center coating regions 105Y have a larger taper angle θ (see FIG. 17A), and portions defining end coating regions 105X have a smaller taper angle θ (see FIG. 17C). Preferably, the taper angle gradually decreases from the center to either end of a luminescent region along the long axis (see FIGS. 17A to 17C).

The taper angle of bank 107 may be adjusted by appropriately adjusting the gray values of a multi-level photoresist mask (gray tone mask or half tone mask) used for its formation by photolithography. For example, a positive photoresist is employed as the bank material, and the photoresist is patterned by exposing it through a mask having increasing values of light transmittance toward either end of the linear luminescent region.

The end coating regions can be made large in volume by decreasing the taper angle of the bank defining the end coating regions and increasing the taper angle of the bank defining the center coating regions. It is thus possible to increase the ink amount in the end coating regions and to equalize ink drying rates in the respective coating regions.

The present application claims the priority of Japanese Patent Application No. 2008-222552 filed on Aug. 29, 2008, the entire contents of which are herein incorporated by reference.

INDUSTRIAL APPLICABILITY

A manufacturing method of an organic EL display panel of the present invention can produce organic functional layers of the uniform thickness among different pixels and thus can manufacture an organic EL display panel with no light emission unevenness. In addition, even when an inkjet head is used which includes a given number of nonfunctional nozzles, it is possible to apply a required amount of ink to all coating regions, thereby leading to improved manufacturing yields.

EXPLANATION OF REFERENCE NUMERALS

10 . . . Substrate
11 . . . Bank
12 . . . Luminescent region
20 . . . Inkjet head
21 . . . Nozzle
100, 200, 300 . . . TFT substrate
101 . . . Substrate
103 . . . Luminescent region
105 . . . Coating region
107 . . . Bank
109 . . . Pixel electrode
111 . . . Organic functional layer
150 . . . Inkjet head
151 . . . Nozzle

The invention claimed is:

1. An organic EL display panel comprising:
a substrate which includes a plurality of luminescent regions which are arranged side by side in a specific direction and run in parallel to one another;
a bank formed over the substrate, the bank defining a plurality of coating regions in each of the luminescent regions, the coating regions being aligned in a row along the long axis of the luminescent region; and
a pixel electrode provided in each of the coating regions, the pixel electrode having a long axis which is in parallel with the long axis of the luminescent region, wherein
in each of the luminescent regions, the coating region positioned at a lengthwise end of the luminescent region is larger in size than the coating region positioned at a lengthwise center of the luminescent region, and
in each of the luminescent regions, the number of the pixel electrodes in the coating region positioned at the lengthwise end of the luminescent region outnumbers the number of the pixel electrodes in the coating region positioned at the lengthwise center of the luminescent region.

2. The organic EL display panel according to claim 1, wherein the coating regions monotonically decrease in size from the lengthwise ends to the lengthwise center of the luminescent regions.

3. The organic EL display panel according to claim 1, wherein the average area of the coating regions in each of the luminescent regions positioned at both edges in the specific direction of the panel is larger than the average area of the coating regions in the luminescent region positioned at a center in the specific direction of the panel.

4. The organic EL display panel according to claim 3, wherein the coating region positioned at the lengthwise center of the luminescent region positioned at the edge in the specific direction of the panel is larger than the coating region positioned at the lengthwise center of the luminescent region positioned at the center in the specific direction of the panel.

* * * * *